(12) United States Patent
Giboney

(10) Patent No.: US 6,740,908 B1
(45) Date of Patent: May 25, 2004

(54) EXTENDED DRIFT HETEROSTRUCTURE PHOTODIODE HAVING ENHANCED ELECTRON RESPONSE

(75) Inventor: Kirk S. Giboney, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/391,948

(22) Filed: Mar. 18, 2003

(51) Int. Cl.[7] .................. H01L 29/732; H01L 31/0328; H01L 31/0336; H01L 31/072; H01L 31/109

(52) U.S. Cl. .............. 257/185; 257/190; 257/196; 257/458; 257/656

(58) Field of Search ................. 257/184, 185, 257/190, 196, 458, 656

(56) References Cited

U.S. PATENT DOCUMENTS

| | | |
|---|---|---|
| 5,818,096 A | 10/1998 | Ishibashi et al. |
| 2003/0089958 A1 * | 5/2003 | Gutierrez-Aitken et al. 257/458 |
| 2003/0205713 A1 * | 11/2003 | Sato ........................... 257/85 |

OTHER PUBLICATIONS

N. Erneis, H. Schumacher, and H. Beneking, "High–Speed GaInAs Schottky Photodetector," Electronic Letters, vol. 21, No. 5, Feb. 1985, pp. 180–181.

John E. Bowers and Charles A. Burrus, Jr., "Ultrawide.Band Long–Wavelength p.i.n Photodetectors," Journal of Lightwave Technology, vol. LT.5, No. 10, Oct. 1987, pp. 1339–1350.

Kirk S. Giboney, "Travelling–Wave Photodetectors," Doctoral Dissertation, University of California, Santa Barbara, Aug. 1995, Chapter 6, Sections 6.1 and 6.2, pp. 123–127.

Frank J. Effenberger and Abhay M. Joshi, "Ultrafast, Dual–Depletion Region InGaAs/InP p.i.n Detector," Journal of Lightwave Technology, vol. 14, No. 8, Aug. 1996, pp. 1859–1864.

Kazutoshi Kato, "Ultrawide–Band/High–Frequency Photodetectors," IEEE Transactions on Microwave Theory and Techniques, vol. 47, No. 7, Jul. 1999, pp. 1265–1281.

Tadao Ishibashi, Tomofumi Furuta, Hiroshi Fushimi, Satoshi Kodama, Hiroshi Ito, Tadao Nagatsuma, Naofumi Shimizu, and Yutaka Miyamoto, "InP/InGaAs Uni–Traveling–Carrier Photodiodes," IEICE Trans. Electron., vol. E83.C, No. 6, Jun. 2000, pp. 938–949.

* cited by examiner

*Primary Examiner*—Ngân V. Ngô

(57) ABSTRACT

An enhanced extended drift heterostructure (EEDH) photodiode and method of making provide enhanced electron response. The EEDH photodiode includes adjacent first and second light absorption layers, an ohmic anode contact interfaced to the first layer and a cathode contact interfaced to the second layer. The cathode contact includes either a Schottky cathode contact or an ohmic cathode contact and a contact layer. The EEDH photodiode optionally further includes one or more of a carrier block layer interfaced to the first layer, a graded characteristic in the first layer, and a collector layer interfaced to the second layer. The first layer has a doping concentration that is greater than doping concentrations of the second layer and the optional collector layer. The first and second layers have band gap energies that facilitate light absorption. The optional layers have band gap energies that are relatively nonconducive to light absorption.

15 Claims, 9 Drawing Sheets

EXTENDED DRIFT HETEROSTRUCTURE PHOTODIODE HAVING ENHANCED ELECTRON RESPONSE

TECHNICAL FIELD

The invention relates to photodiodes. In particular the invention relates to photodiodes having high bandwidth-efficiency products used in optical network receivers.

BACKGROUND ART

Semiconductor photodetectors, most notably various forms of photodiodes, absorb incident light in the form of photons and convert the absorbed photons into an electric current. The current within a lattice of the semiconductor is often represented in terms of 'free carriers' or simply 'carriers'. In particular, when a photon with sufficient energy interacts with an atom of the semiconductor lattice, an electron associated with the atom moves across an energy band gap from a valence shell or band to a conduction shell or band of the semiconductor. Movement of the electron across the band gap creates a negative carrier, i.e., the electron, and leaves behind a positive carrier known as a 'hole'. After carrier generation through photon absorption, a carrier transport mechanism within the semiconductor-based photodetector separates the generated holes and electrons, thereby creating an electric current known generally as a photocurrent. In general, both the electron and the hole may act as carriers within the semiconductor and contribute to the photoelectric current. The photocurrent thus created enables' the photodetector to interact in various ways with an external circuit or system. Among other things, photodiodes find wide-scale application in optical receivers used for optical communication networks.

Photodetector performance is often summarized in terms of bandwidth, efficiency, maximum current output, and optical wavelength range. Bandwidth is a measure of a speed of response of the photodetector to changes in an incident optical signal or light source. Efficiency indicates how much of the incident optical signal is converted into carriers. Maximum current output is typically determined by a saturation condition within the semiconductor of the photodetector while optical wavelength range is a function of certain material properties of the photodetector among other things. In general, photodetector performance is limited by a combination of material properties of constituent materials of the photodetector and a structural characteristic of the photodetector associated primarily with a type and/or structure of a given photodetector.

For example, FIG. 1A illustrates a cross sectional view of a conventional positive-intrinsic-negative (PIN) photodiode 10. The PIN photodiode 10 comprises an intrinsic or lightly doped semiconductor layer 14 (i-layer) sandwiched between a p-type semiconductor layer 12 (p-layer) and an n-type semiconductor layer 15 (n-layer). The i-layer 14 is often referred to as a photoactive or a light absorption layer 14 since ideally, photon absorption is primarily confined to the i-layer 14 of the PIN diode 10. Typically a deposited metal, such as aluminum (Al), or another conductive material, such as heavily doped polysilicon, form a pair of ohmic contacts 17a, 17b, that provide an electrical connection between the PIN photodiode and an external circuit.

The ohmic contact 17a connected to the p-layer 12 is an anode contact 17a while the ohmic contact 17b connected to the n-layer 15 is a cathode contact 17b. Typically, the PIN photodiode 10 is formed on and structurally supported by a semi-insulating substrate 19.

FIG. 1B illustrates a band diagram 20 of the PIN photodiode 10 illustrated in FIG. 1A. The band diagram 20 depicts energy levels as electron-volts (eV) in a vertical or y-direction and physical length or distance along a conduction path within a device in a horizontal or x-direction. Thus, the band diagram 20 illustrates a valence band energy level 21 and a conduction band energy level 22 separated by a band gap 23 for each of the layers of the PIN photodiode 10. When a hole 30 and electron 32 are separated by absorption of a photon by the photoactive i-layer 14, the hole 30 moves in the i-layer 14 toward the p-layer 12 under the influence of an electric potential gradient formed by an inherently lower energy level of the p-layer 12 for holes. Once the hole reaches the p-layer 12, the hole combines at the anode ohmic contact 17a with an electron supplied by the external circuit (not illustrated). Similarly, the electron 32 moves in the i-layer 14 toward the n-layer 15 under the influence of an electric potential gradient formed by the inherently lower energy level of the n-layer 15 for electrons. Electrons in the n-layer 15 enter the cathode contact 17b. The drift or movement of electrons 32 and holes 30 in the i-layer 14 drives or creates an electric current in the n-layer 15, the p-layer 12, and the external circuit.

Among the performance limitations associated with the conventional PIN photodiode is a bandwidth limitation due to the time required for the transport of holes 30 and electrons 32 within the i-layer 14. In particular, holes 30 are known to have a much slower transport velocity than that of electrons 32. The slower transport velocity of holes 30 results in a transport time for the holes 30 that is much longer than a transport time of the electrons 32. The longer hole transport time normally dominates and ultimately limits an overall response time or bandwidth of the PIN photodiode 10.

Accordingly, it would be advantageous to have a photodiode that overcomes the bandwidth-efficiency product limitations associated with conventional PIN photodiodes. Such a photodiode would solve a longstanding need in the area of photodiodes for optical networking.

SUMMARY OF THE INVENTION

The present invention provides an extended drift heterostructure (EDH) photodiode with enhanced electron response. In particular, the present invention is an enhanced EDH (EEDH) photodiode that employs an additional p-type light absorption layer. The additional p-type light absorption layer promotes unidirectional photo-generated minority carrier (e.g., electron) drift or motion within the photodiode according to the present invention. The unidirectional electron carrier motion effectively enhances an electron contribution to a device photocurrent without degrading an overall device bandwidth.

In an aspect of the invention, an enhanced extended drift heterostructure (EEDH) photodiode is provided. The EEDH photodiode comprises a first layer comprising a semiconductor having a first doping concentration that maintains a charge neutrality condition in at least a portion of the first layer. The EEDH photodiode further comprises a second layer adjacent and interfaced to the first layer. The second layer comprises a semiconductor having a second doping concentration that is lower than the first doping concentration, such that a non-neutral charge condition is maintained. The first and second layers comprise respective first and second band gap energies that facilitate light absorption by the first and second layers. The EEDH photodiode further comprises an ohmic anode contact directly or indirectly interfaced to the first layer and a cathode contact directly or indirectly interfaced to the second layer. A characteristic of one or more of the layers in addition to the second layer directs a movement of photo-generated electrons away from the ohmic anode contact.

In some embodiments, the characteristic that directs the movement of the photo-generated electrons is manifested in a carrier block layer adjacent and interfaced to the first layer on a side opposite to the second layer. The carrier block layer comprises a semiconductor having a block band gap energy that is greater than the first and second band gap energies, such that a block energy barrier is created between the first layer and the carrier block layer to so direct the electron movement. In other embodiments, the characteristic that so directs the electron movement is either further manifested in the first layer or alternatively manifested in the first layer. The first layer has the first band gap energy and the first doping concentration, either or both of which is graded to produce a quasi-field. The quasi-field preferentially moves the photo-generated electrons toward the second layer.

Further in some embodiments of the present invention, the cathode contact comprises a Schottky cathode contact interfaced to the second layer. In other embodiments, the cathode contact comprises an ohmic cathode contact interfaced to the second layer and a contact layer between the ohmic cathode contact and the second layer. The contact layer comprises a semiconductor in a second conduction type relative to a first conduction type of the semiconductor of the first layer.

In yet another aspect of the present invention, a method of constructing the EEDH photodiode of the present invention is provided.

The EEDH photodiode according to the present invention exploits and improves bandwidth versus transit-time characteristics compared to conventional PIN photodiodes. The collector layer essentially extends a drift region of the photodiode of the present invention compared to a conventional photodiode, such that a decreased capacitance of the photodiode results. Such decreased capacitance allows the use of a larger active area. Increased active area increases an efficiency of the photodiode according to the present invention. Additionally, a characteristic of the photodiode of the present invention in some embodiments associated with the presence of the carrier block layer exploits short transit times of photo-generated electrons to improve device bandwidth. Thus, an improved bandwidth-efficiency product ultimately may be achieved with the EEDH photodiode, according to the present invention, when compared to conventional photodiodes. Certain embodiments of the present invention have other advantages in addition to and in lieu of the advantages described hereinabove. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1A:
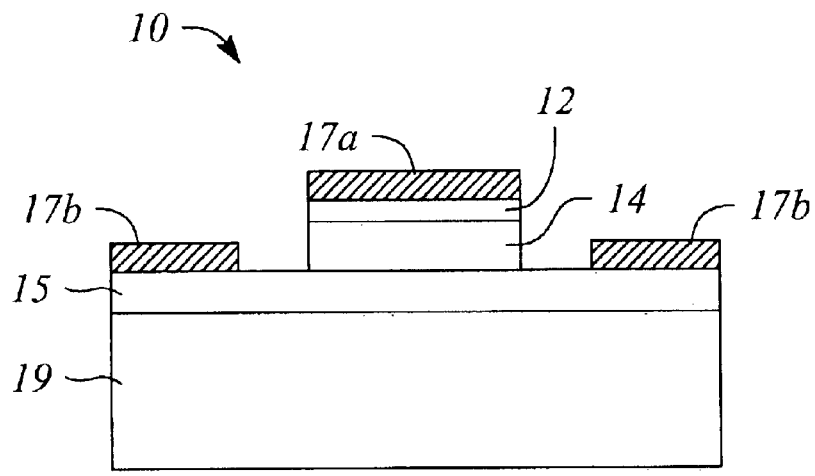
FIG. 1A illustrates a cross sectional view of a conventional vertically illuminated positive-intrinsic-negative (PIN) photodiode.
Figure 1B:
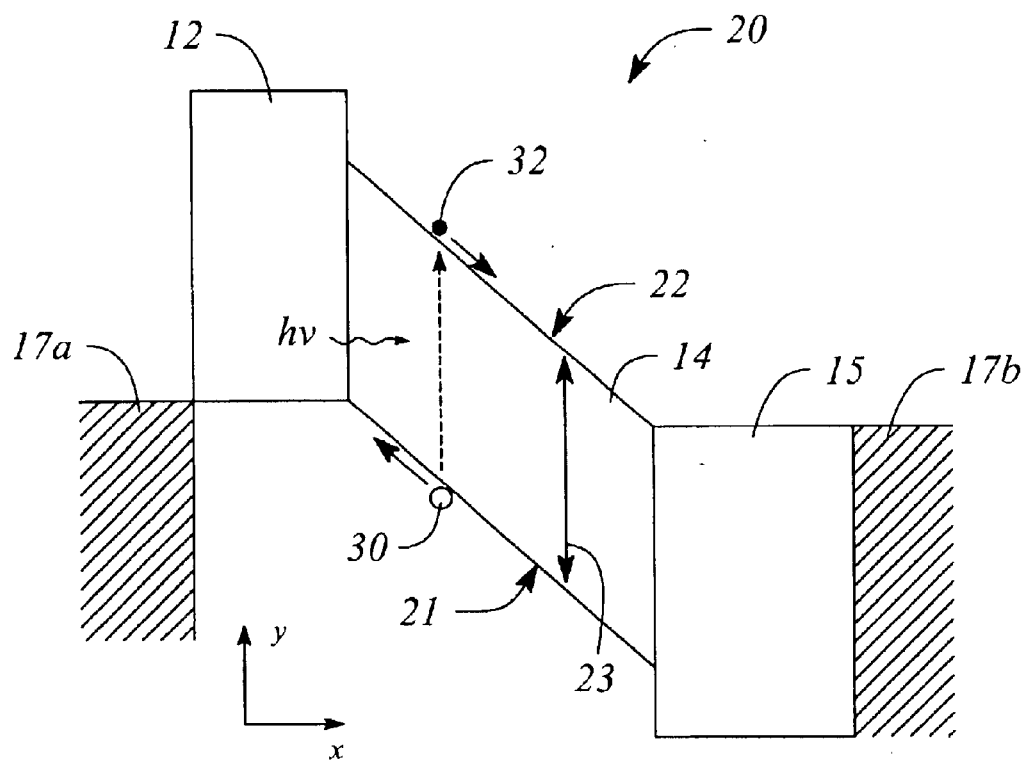
FIG. 1B illustrates a band diagram for the PIN photodiode illustrated in FIG. 1A.
Figure 2A:
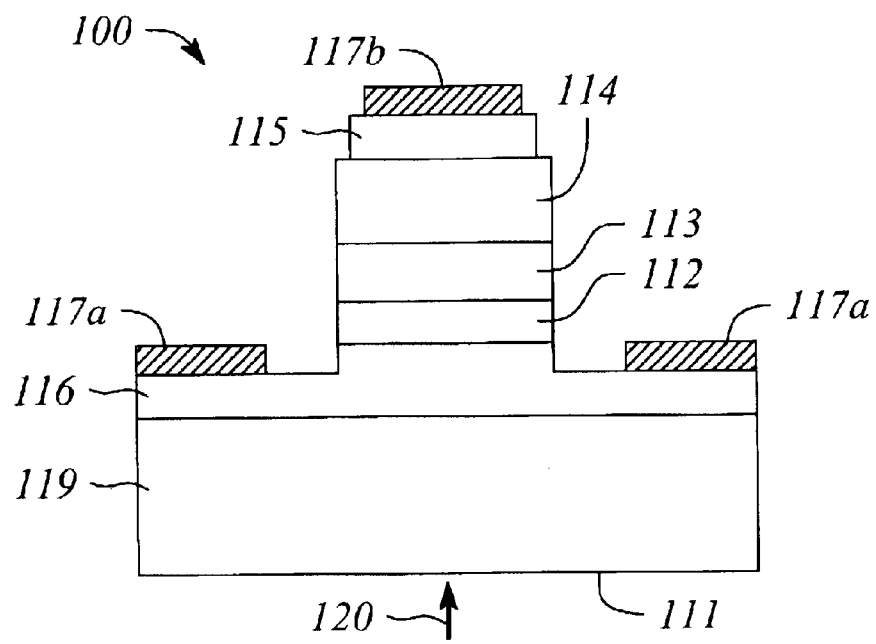
FIG. 2A illustrates a cross sectional view of a vertically illuminated enhanced extended drift heterostructure photodiode according to an embodiment of the present invention.
Figure 2B:
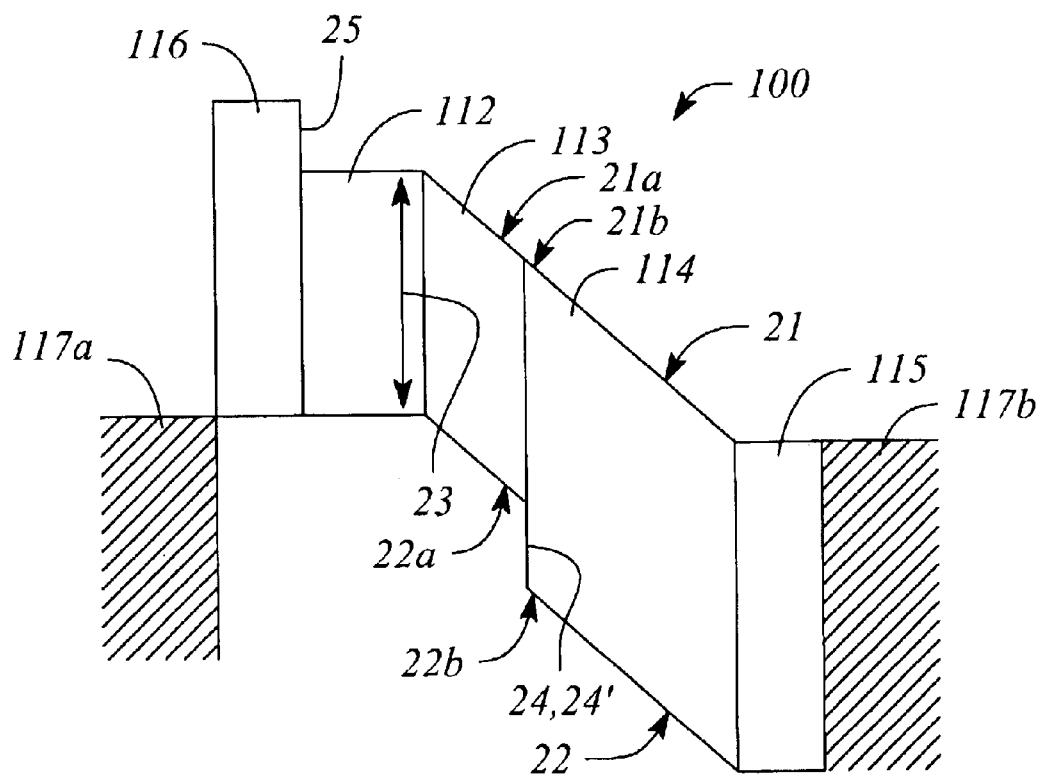
FIG. 2B illustrates a band diagram for the enhanced extended drift heterostructure photodiode embodiment illustrated in FIG. 2A.

FIG. 2A illustrates a cross sectional view of a vertically illuminated enhanced extended drift heterostructure (EEDH) photodiode 100 according to an embodiment of the present invention. FIG. 2B illustrates a band diagram for the EEDH photodiode 100 embodiment illustrated in FIG. 2A. Although illustrated and described as a vertically illuminated photodiode, for the purposes of discussion hereinbelow, the vertical illumination is not intended to limit the scope of the present invention in any way. For example, one skilled in the art may readily manufacture the EEDH photodiode 100 in the form of a horizontally illuminated or waveguide photodiode without undue experimentation given the discussion hereinbelow and still be within the scope of the present invention.

The EEDH photodiode 100 comprises a first light absorption layer 112, a second light absorption layer 113 adjacent to a side of the first light absorption layer 112, and a carrier-traveling or collector layer 114 adjacent to a side of the second light absorption layer 113 opposite to a side of the second light absorption layer 113 that is adjacent to the first light absorption layer 112. The photodiode 100 further comprises a carrier block layer 116 adjacent to a side of the first light absorption layer 112 opposite the side to which the second light absorption layer 113 is adjacent, and a contact layer 115 adjacent to and covering a portion of a surface of the collector layer 114 on a side opposite to a side of the collector layer 114 that is adjacent to the second light absorption layer 113. The EEDH photodiode 100 further comprises a first ohmic contact 117a connected to the carrier block layer 116 and a second ohmic contact 117b connected to the contact layer 115. The first ohmic contact 117a functions as an anode contact for the EEDH photodiode 100 while the second ohmic contact 117b serves as a cathode contact according to the present invention. In some embodiments, the EEDH photodiode 100 may be mounted or formed on a supporting surface of a semi-insulating substrate 119.

The first light absorption layer 112 is a semiconductor of a first conduction type, for example, a p-type semiconductor. The semiconductor of the first light absorption layer 112 preferably has a band gap that facilitates light absorption/conversion in an optical wavelength range of interest. In addition, the first light absorption layer 112 semiconductor has a doping concentration sufficient to maintain charge neutrality in at least a portion of the layer 112 under a biased state or condition of the photodiode 100. In other words, the semiconductor of the first light absorption layer 112 is chosen such that a band gap energy of the layer 112 is less than or approximately equal to a mean or an average energy (e.g., hv) of an incident photon. Moreover, when an electrical bias is applied to the EEDH photodiode 100, the doping concentration of the first light absorption layer 112 is such that carriers are essentially undepleted within at least a portion of the layer 112. While the EEDH photodiode 100 may be operated with a bias of zero volts (V), such as when an output current level is low, preferably the first light absorption layer 112 remains essentially undepleted within at least a portion of the first light absorption layer 112 when a reverse bias of up to a breakdown voltage of the photodiode 100 is applied to the photodiode 100. Advantageously, the absorption of light by the first light absorption layer 112 helps to increase an efficiency and a total photocurrent of the photodiode 100 when compared to a conventional photodiode.

The first light absorption layer 112 may be a III–V compound semiconductor such as, but not limited to, gallium-aluminum-arsenide (GaAlAs) doped with a p-type dopant. Other potentially suitable p-type doped III–V semiconductors for use as the first light absorption layer 112 include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs), gallium-indium-arsenide-phosphide (GaInAsP). Such p-type III–V compound semiconductors and related materials are known to have band gap energies or band gaps that are suitable for use as the first light absorption layer 112. Moreover, doping concentrations sufficient to allow such semiconductors to remain essentially undepleted under bias conditions may be readily achieved in practice. For example, for a p-type doped III–V compound semiconductor of $Ga_{0.47}In_{0.53}As$ employed as the first light absorption layer 112, a doping concentration of approximately $p=2\times10^{17}$ may be used. One skilled in the art can readily determine and produce other suitable doping concentrations for the first light absorption layer 112 without undue experimentation.

The second light absorption layer 113 of the photodiode 100 is a depleted semiconductor having a dopant concentration that is lower than that of the first light absorption layer 112. In particular, the second light absorption layer 113 has a doping concentration such that the layer 113 operates within the photodiode 100 as being essentially or substantially depleted. In some embodiments, the second light absorption layer 113 is a lightly doped or undoped semiconductor and is essentially similar to an intrinsic layer (i-layer) of a conventional PIN photodiode in that the second light absorption layer 113 supports all or a portion of the drift or transport field, and thus is identifiable with the intrinsic layer (i-layer) 14 of PIN photodiode 10. A layer being 'depleted', 'essentially depleted' or 'substantially depleted' means that there are few or no free carriers available within the layer such that all or a portion of the drift or transport field is supported across the layer.

In addition, the semiconductor of the second light absorption layer 113 preferably has a band gap energy that facilitates light absorption and conversion in an optical wavelength range of interest. In other words as with the first light absorption layer 112, the semiconductor of the second light absorption layer 113 is chosen such that the band gap energy is less than or approximately equal to a mean or an average energy (e.g., hv) of an incident photon.

The second light absorption layer 113 may be a III–V compound semiconductor such as, but not limited to, gallium-aluminum-arsenide (GaAlAs) undoped or lightly doped with a p-type dopant. Other potentially suitable III–V semiconductors for use as the second light absorption layer 112 include, but are not limited to, indium-phosphide (InP) or materials lattice-matched to InP, gallium-arsenide-antimonide (GaAsSb), Gallium-indium-arsenide (GIanAs), aluminum-gallium-arsenide-antimonide (AlGaAsSb), aluminum-gallium-indium-arsenide (AlGaInAs), gallium-indium-arsenide-phosphide (GaInAsP). Such III–V compound semiconductors and related materials are known to have band gaps that are suitable for use as the second light absorption layer 113. Moreover, doping concentrations sufficient to allow such semiconductors to remain essentially depleted under bias conditions may be readily achieved in practice. One skilled in the art can readily determine and produce a suitable doping concentration for the second light absorption layer 113 without undue experimentation.

The collector layer 114 of the photodiode 100 is a semiconductor having a dopant concentration that is lower than that of the first light absorption layer 112. Moreover, the semiconductor of the collector layer 114 preferably has a band gap energy that is greater than that of the light absorption layer 112. In some embodiments, the collector layer 114 is a lightly doped or undoped semiconductor and is essentially similar to an intrinsic layer (i-layer) of a conventional PIN photodiode in that the collector layer 114 supports a portion of the drift or transport field, and thus is identifiable with the intrinsic layer (i-layer) 14 of PIN photodiode 10. Thus in some embodiments, the doping concentration of the collector layer 114 may be essentially similar to the doping concentration of the second light absorption layer 113.

As mentioned hereinabove, the collector layer 114 preferably has a band gap that is greater than that of the first light absorption layer 112. The band gap of the collector layer 114 is greater than that of the second light absorption layer 113 also. Additionally as illustrated in FIG. 2B, a small offset of the conduction band energy 21a of the second light absorption layer relative to the conduction band energy 21b of the collector layer often is desirable to facilitate movement of photo-generated electrons from the first light absorption layer 112 and the second light absorption layer 113 into the collector layer 114. As a result, there is a mismatch 24' in the valence band energy levels 22 between the second light absorption layer 113 and the collector layer 114. The mismatch 24' manifests itself as an abrupt change from a relatively higher valence energy level 22a within the second light absorption layer 113 to a lower valence energy level 22b just inside the collector layer 114. The presence of the mismatch 24' prevents or impedes holes generated and/or present in the light absorption layers 112, 113 from entering the collector layer 114. Thus, the mismatch 24' acts a barrier 24 to the movement of holes into the collector layer 114.

However, while the mismatch 24' acts as the barrier 24, the barrier 24 is neither essential nor necessary according to the present invention since the fields in the second light absorption layer 113 and the collector layer 114 naturally oppose the movement of holes into the collector layer 114. As such, when holes are generated, the holes preferentially drift and/or diffuse (i.e., move) away from the collector layer 114 and toward the carrier block layer 116 and the first ohmic contact 117a. Holes also move away from the collector layer 114 and toward the carrier block layer 116 and the first ohmic contact 117a in small fields generated by the photocurrent such that current continuity is maintained throughout the photodiode 100.

The collector layer 114 extends a drift region or distance for electrons generated in the first light absorption layer 112 and the second light absorption layer 113, such that the relative electron contribution to photocurrent is increased. Since electron drift velocity is generally faster than hole drift velocity, it is preferable for the photocurrent to be derived primarily from electron motion. In addition, the presence of the collector layer 114 as a depleted semiconductor decreases a capacitance of the photodiode 100. Decreased capacitance decreases a resistor-capacitor (RC) time constant of a time response of the photodiode 100 leading to an increase in an effective operational bandwidth compared to a conventional photodiode.

As with the first and second light absorption layers 112, 113, the collector layer 114 may be a III–V compound semiconductor. However, as already noted, the collector layer 114 has a lower doping concentration and higher band gap than that of the first light absorption layer 112. Thus, the collector layer 114 may be a lightly doped or undoped semiconductor such as, but not limited to, indium phosphide (InP). Other materials suitable for the collector layer 114 include, but are not limited to, undoped or lightly doped materials that are lattice matched to InP, undoped or lightly doped gallium-arsenide-antimonide (GaAsSb), undoped or lightly doped gallium-indium-arsenide (GaInAs), undoped or lightly doped aluminum-gallium-arsenide-antimonide (AlGaAsSb), undoped or lightly doped aluminum-gallium-indium-arsenide (AlGaInAs), undoped or lightly doped gallium-indium-arsenide-phosphide (GaInAsP). For example, given that the collector layer 114 preferably has a larger band gap than that of the light absorption layers 112, 113, if GaInAs is employed as the light absorption layers 112, 113 semiconductor in an exemplary photodiode 100 of the present invention, then InP may be used for the collector layer 114 semiconductor.

In some embodiments, a conduction band matching layer (not illustrated) may be employed between the second light absorption layer 113 and the collector layer 114 to reduce a heterojunction conduction band energy barrier that may form or be present between the second light absorption layer 113 and the collector layer 114. If a conduction band energy of the collector layer 114 is greater than that of the second light absorption layer 113, then there will be an undesirable barrier to transport of electrons from the second light absorption layer 113 into the collector layer 114. The conduction band matching layer may reduce a photodiode response time by effectively reducing this barrier and facilitating the movement of electrons from the second light absorption layer 113 into the collector layer 114.

The conduction band matching layer may be a III–V compound semiconductor or combination of III–V compound semiconductors. The semiconductor(s) of the conduction band matching layer may be of a first conduction type, for example p-type and/or of a second conduction type, for example n-type. Thus for example, the conduction band matching layer may be a III–V compound semiconductor such as, but not limited to, a single gallium-indium-arsenide-phosphide (GaInAsP) layer or several layers of differing GaInAsP alloy compositions, each one being appropriately doped. Other potentially suitable doped III–V semiconductors for use as the conduction band matching layer include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs). One skilled in the art can readily determine and produce suitable semiconductor layers with appropriate doping concentrations for the conduction band matching layer without undue experimentation. A description of an application of such matching layers to high speed photodetectors is provided by Yih-Guei Wey et al, "110 GHz GaInAs/InP Double Heterostructure p-i-n Photodetectors," *J. Lightwave Technol.*, vol. 13, no. 7, pp. 1490–1499, July, 1995, incorporated herein by reference.

The carrier block layer 116 is a semiconductor of the first conduction type, for example a p-type semiconductor. The semiconductor of the carrier block layer 116 has a band gap that is greater than the band gap of the light absorption layers 112, 113. The band gap of the carrier block layer 116 being greater than that of the light absorbing layers 112, 113 at least reduces, and preferably greatly reduces or substantially prevents, a chance that free electrons created in the light absorption layers 112, 113 will move in a direction of the carrier block layer 116. In particular, the band gap of the carrier block layer 116 acts a barrier 25 to movement of electrons from the light absorption layers 112, 113 into the carrier block layer 116. As free carriers are created through photon absorption, the electrons preferentially flow away from the boundary (e.g., barrier 25). Thus, the carrier block layer 116 effectively directs electron flow toward the collector layer 114 and ultimately to the cathode contact 117b.

In addition to directing the flow of electrons toward the collector layer 114, the relatively greater band gap of the carrier block layer 116 reduces a chance that a photon incident on the carrier block layer 116 will create a pair of free carriers within the layer 116. As such, the photo-generation of the carriers is essentially and preferentially confined to the light absorption layers 112, 113. Moreover, the photocurrent consists mostly of photo-generated electrons flowing from the light absorption layers 112, 113 through the collector layer 114 and into the contact layer 115 and cathode contact 117b. A lesser fraction of the photocurrent consists of holes photo-generated and flowing in the second light absorption layer 113 toward the first light absorption layer 112.

As is the case for the collector layer 114 and light absorption layers 112, 113, the carrier block layer 116 may be a III–V compound semiconductor. As already noted, the carrier block layer 16 has a band gap that is greater than the band gap of the light absorption layers 112, 113. In particular, the carrier block layer 116 may be a relatively heavily doped p-type III–V compound semiconductor, such as, but not limited to, gallium-indium-arsenide-phosphide (GaInAsP). Other suitable p-type heavily doped III–V semiconductors for use as the carrier block layer 116 include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs), gallium-aluminum-arsenide (GaAlAs). For example, if a p-type III–V compound semiconductor of $Ga_{0.47}In_{0.53}As$ with a doping concentration of approximately $p=2\times10^{17}$ is used as the first light absorption layer 112, then a p-type III–V compound semiconductor of $Ga_{0.27}In_{0.73}As_{0.6}P$ with a doping concentration preferably greater than $p=2\times10^{17}$ may be used as the carrier block layer 116. Given the discussion herein, one skilled in the art can readily determine a suitable choice of material for the carrier block layer 116 and a sufficient doping concentration without undue experimentation.

In some embodiments, a valence band matching layer (not illustrated) may be employed between the first light absorption layer 112 and the carrier block layer 116 to reduce a heterojunction valence band energy barrier that may form between the first light absorption layer 112 and the carrier block layer 116. An offset in the valence band energy between the first light absorption layer 112 and the carrier block layer 116 will result in an undesirable barrier to transport of holes from the first light absorption layer 112 into the carrier block layer 116 or from the carrier block layer 116 into the first absorption layer 112. The valence band matching layer may reduce a series resistance of the EEDH photodiode 100 by facilitating the movement of holes from the first light absorption layer 112 into the carrier block layer 116.

The valence band matching layer may be a III–V compound semiconductor or combination of III–V compound semiconductors. The semiconductor(s) of the valence band matching layer may be of a first conduction type, for example p-type. Thus for example, the valence band matching layer may be a III–V compound semiconductor such as, but not limited to, a single gallium-indium-arsenide-phosphide (GaInAsP) layer or several layers of differing GaInAsP alloy compositions, each one appropriately doped. Other potentially suitable doped III–V semiconductors for use as the valence band matching layer include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs). The valence band matching layer between the first light absorption layer 112 and the carrier block layer 116 is similar in concept to the conduction band matching layer described hereinabove between the second light absorption layer 113 and the collector layer 114. One skilled in the art can readily determine and produce suitable semiconductor layers with appropriate doping concentrations for the valence band matching layer without undue experimentation.

The contact layer 115 is a semiconductor of a second conduction type, for example, an n-type semiconductor. Preferably, a doping concentration of the contact layer 115 is relatively high to reduce series resistance within the contact layer 115. Moreover, the semiconductor of the contact layer 115 preferably has a band gap that is greater than that of the light absorption layers 112, 113. In some embodiments, the contact layer 115 is a heavily doped n-type semiconductor and is essentially similar to an n-layer of a conventional PIN photodiode in that the contact layer 115 supports a connection of the cathode ohmic contact 117b to the photodiode 100, and thus is identifiable with the n-layer 15 of the PIN photodiode 10.

The contact layer 115 may be an n-type III–V compound semiconductor. As already noted, the contact layer 115 has a band gap that is greater than the band gap of the light absorption layers 112, 113. In particular, the contact layer 115 may be a relatively heavily doped n-type III–V compound semiconductor, such as, but not limited to, gallium-indium-arsenide-phosphide (GaInAsP). Other suitable n-type heavily doped III–V semiconductors for use as the contact layer 115 include, but are not limited to, indium-phosphide (InP) or materials lattice-matched to InP, gallium-arsenide-antimonide (GaAsSb), Gallium-indium-arsenide (GaInAs), aluminum-gallium-arsenide-antimonide (AlGaAsSb), aluminum-gallium-indium-arsenide (AlGaInAs), gallium-aluminum-arsenide (GaAlAs). For example, if a p-type III–V compound semiconductor of $Ga_{0.47}In_{0.53}As$ with a doping concentration of approximately $p=2\times10^{17}$ is used as the first light absorption layer 112, then an n-type III–V compound semiconductor of $Ga_{2.27}In_{0.73}As_{0.6}P$ with a doping concentration preferably greater than $n=2\times10^{17}$ may be used as the contact layer 115. Given the discussion herein, one skilled in the art is familiar with n-type contact layers in PIN diodes and can readily determine a suitable choice of material and doping concentration for the contact layer 115 without undue experimentation.

The first or anode ohmic contact 117a is an electrical contact that is interfaced with the carrier block layer 116. Similarly, the second or cathode ohmic contact 117b is an electrical contact that is interfaced with the contact layer 115. A metal ohmic contact 117a, 117b is formed using any electrically conductive metal or similar conductor material including, but not limited to, aluminum (Al), silver (Ag), gold (Au), or copper (Cu), heavily doped polysilicon. One skilled in the art is familiar with ohmic contacts, the manufacture of and the metal materials used therefor, all of which are within the scope of the present invention.

The ohmic contacts 117a, 117b may be either directly or indirectly interfaced to the carrier block layer 116 and contact layer 115, respectively. When directly interfaced, anode ohmic contact 117a is formed by depositing metal or another suitable contact material on or adjacent to a surface of the carrier block layer 116. Similarly, the cathode ohmic contact 117b is formed by depositing metal or another suitable contact material on or adjacent to a surface of the contact layer 115. FIG. 2A illustrates in cross section an embodiment of a directly interfaced anode ohmic contact 117a and a directly interfaced cathode ohmic contact 117b. When indirectly interfaced, another layer or layers is/are employed between the anode ohmic contact 117a and the carrier block layer 116 and/or between the cathode contact 117b and the contact layer 115. The other layer or layers may improve a performance of the ohmic contacts 117a, 117b such as, but not limited to, with respect to series resistance and/or contact 117a, 117b adhesion.

For example, a layer of heavily doped semiconductor material (not illustrated) may be used to indirectly connect the anode ohmic contact 117a to the carrier block layer 116.

Figure 2C:
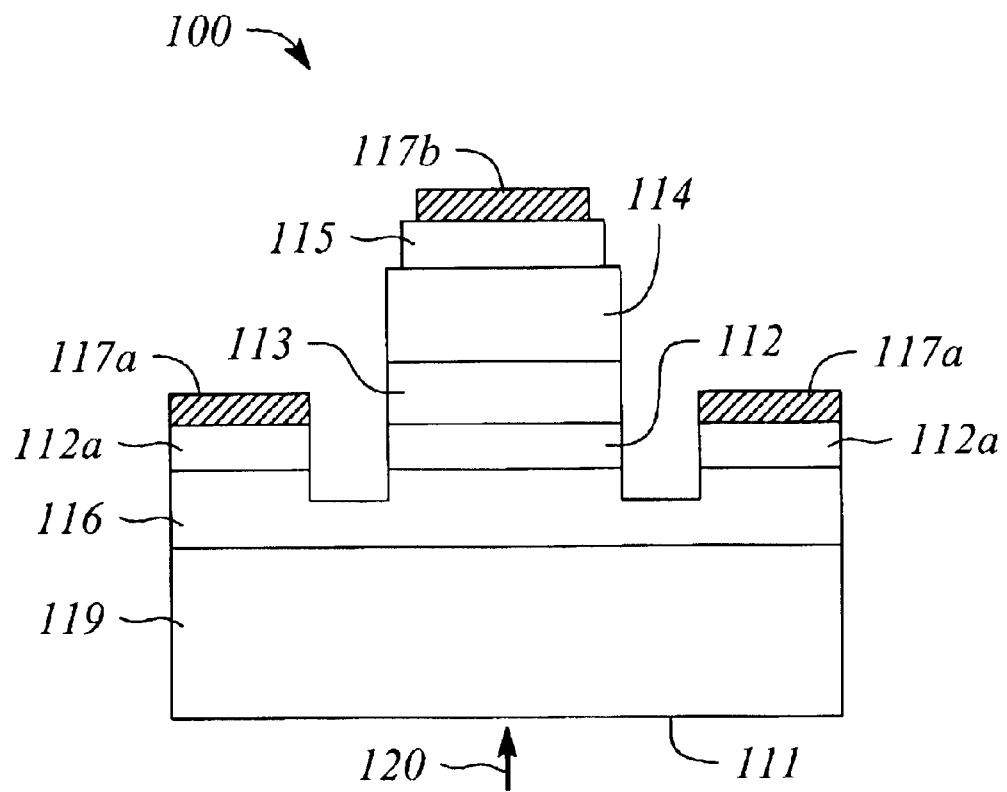
FIG. 2C illustrates a cross sectional view of a vertically illuminated enhanced extended drift heterostructure photodiode having an indirectly interfaced ohmic contact according to an embodiment of the present invention.

In another example, a portion 112a of a layer used to create the first light absorption layer 112 may be physically separated from the first light absorption layer 112 during processing to form the photodiode 100. The physically separated portion 112a is employed to indirectly interface the anode ohmic contact 117a to the carrier block layer 116. FIG. 2C illustrates a cross sectional view of a vertically illuminated EEDH photodiode 100 having an indirectly interfaced anode ohmic contact 117a according to an embodiment of the present invention.

As mentioned, the use of another layer such as, but not limited to, a separated portion 112a of the first light absorption layer 112, may facilitate achieving a lower resistance anode ohmic contact 117a. In particular, it is often difficult to form a good, low resistance, anode ohmic contact 117a on a semiconductor material having a high band gap energy such as that which preferably is used in the carrier block layer 116. Indirect interfacing enables insertion of a material that is more conducive to forming an anode ohmic contact 117a with a lower overall resistance (e.g., materials with a lower band gap energy than that of the carrier block layer 116). Moreover, when the anode ohmic contact 117a is indirectly interfaced to the carrier block layer 116 using the separated portion 112a of the first light absorption layer 112, the use of a valence band matching layer as described hereinabove may further reduce the series resistance. In particular in such an embodiment, the valence band matching layer further reduces series resistance by facilitating the movement of holes from the carrier block layer 116 into a separated portion 112a of the first light absorption layer 112, thereby further reducing series resistance of the anode ohmic contact 117a. One skilled in the art will realize that an analogous situation exists with respect to the cathode contact 117b and the contact layer 115.

The vertically illuminated EEDH photodiode 100 as illustrated in FIG. 2A may be illuminated from a direction, hereinafter referred to as from 'below' the photodiode 100, which corresponds to a side 111 represented by a location of the semi-insulating substrate 119. In other words, reference to 'below' means the side 111 of the photodiode 100 that is opposite to a side of the photodiode 100 that comprises the cathode contact 117b. In particular, incident light 120 in the form of photons may enter the photodiode 100 from the below side 111 passing through the semi-insulating substrate 119. As such, the semi-insulating substrate 119 is preferably transparent or at least translucent to the incident light 120. Likewise, preferably the carrier block layer 116 is transparent or translucent to the incident light 120.

During illumination, photons pass through the semi-insulating substrate 119 and the carrier block layer 116 and enter the light absorption layers 112, 113. Within the light absorption layers 112, 113, the photons, having an energy $E_p$ approximately equal to hv, may impact atoms of the semiconductor lattice and generate a pair of free carriers (e.g., holes and electrons). As already described hereinabove, the electrons thus generated are directed preferentially to diffuse toward the collector layer 114, in part, by the presence and action of the carrier block layer 116 and the barrier 25 formed thereby. Within the second light absorption layer 113 and upon entering the collector layer 114, the electrons are accelerated toward the contact layer 115 and cathode contact 117b by an energy gradient and/or electric field in the second light absorption layer 113 and collector layer 114. Upon reaching the cathode contact 117b, the electrons are absorbed by the cathode contact 117b. In particular, the electrons of the photocurrent may flow through an external circuit. (not shown) attached to the cathode contact 117b.

Similarly, the holes generated by absorption of photons in the first light absorption layer 112 are directed preferentially to diffuse toward the carrier block layer 116 and therethrough to the anode ohmic contact 117a. The principal drift or movement direction is due in large part to the presence of the small fields generated by the photocurrent such that current continuity is maintained throughout the photodiode 100. Moreover, the principal drift or movement direction is due to the electric field present in the second light absorption layer 113 that essentially prevents movement of holes into the layer 113. In addition, any holes generated within the second light absorption layer 113 are further induced to move in the direction of the carrier block layer 116 by the electric field present in the layer 113.

At the anode ohmic contact 117a, the holes may combine or become filled with electrons supplied by the external circuit. In other words, the holes are essentially 'absorbed' by the anode ohmic contact 117a. As such, the photocurrent is largely a function of the electrons flowing from the light absorption layers 112, 113 into the contact layer 115 and cathode contact 117b. Since the photocurrent is made up of mostly minority carriers (i.e., the electrons), which have a much higher mobility and drift velocity than the majority carriers (i.e., the holes), a response time of the photodiode 100 advantageously is reduced compared to that of the conventional PIN photodiode 10. In particular, the reduced response time results in an increased bandwidth for the EEDH photodiode 100 of the present invention relative to the conventional PIN photodiode 10.

Figure 3A:
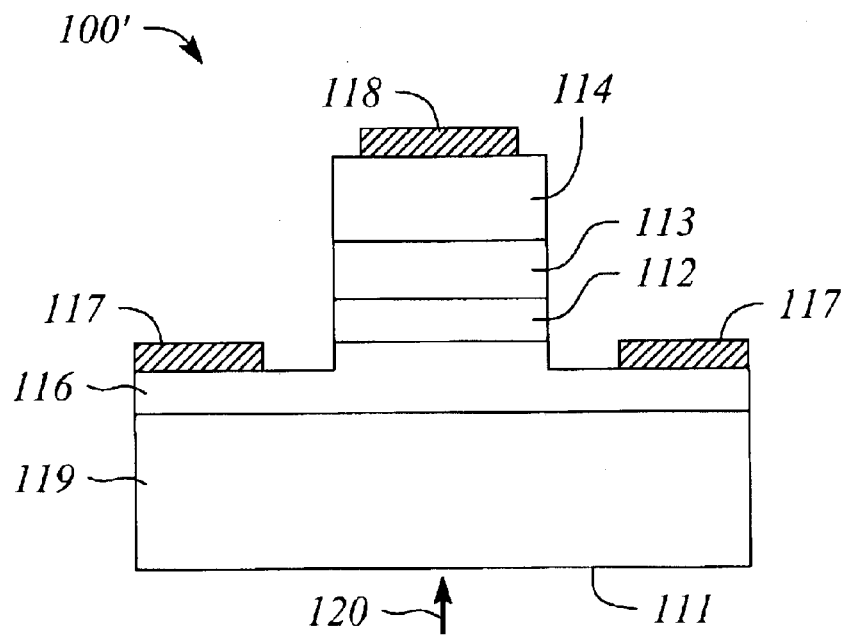
FIG. 3A illustrates a cross sectional view of a vertically illuminated enhanced extended drift heterostructure photodiode having a Schottky Contact according to an embodiment of the present invention.
Figure 3B:
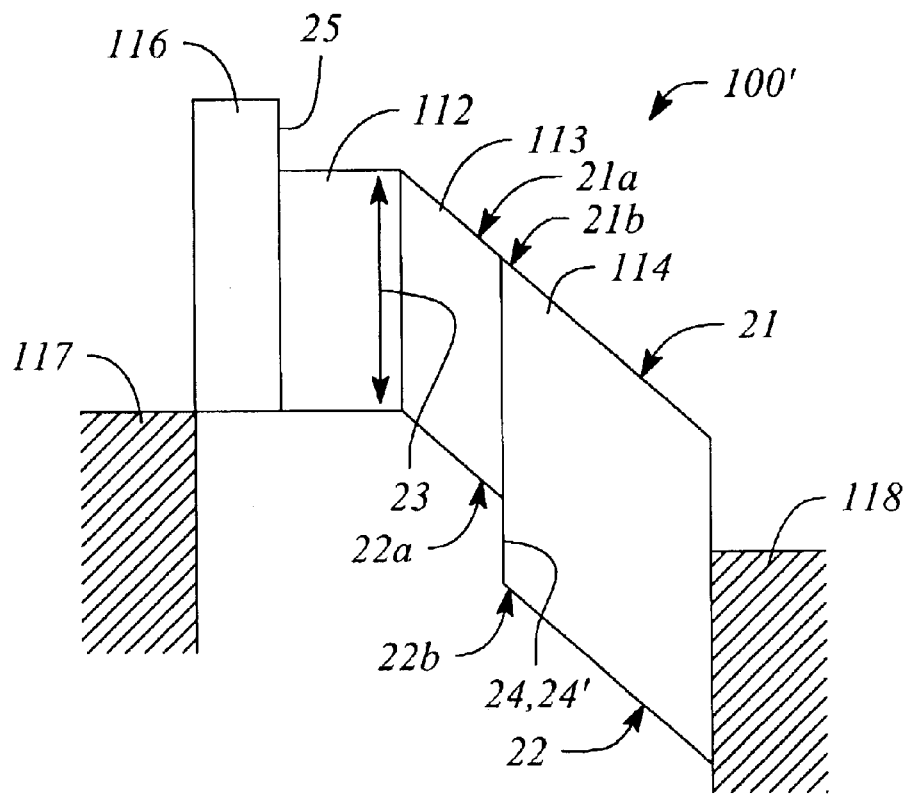
FIG. 3B illustrates a band diagram for the Schottky contact enhanced extended drift heterostructure photodiode embodiment illustrated in FIG. 3A.

In another embodiment, the EEDH photodiode 100' employs a Schottky cathode contact instead of the contact layer 115 and cathode ohmic contact 117b. FIG. 3A illustrates a cross sectional view of a vertically illuminated EEDH photodiode 100' having a Schottky contact according to an embodiment of the present invention. FIG. 3B illustrates a band diagram for the Schottky contact enhanced extended drift heterostructure (SC-EEDH) photodiode 100' embodiment illustrated in FIG. 3A.

The SC-EEDH photodiode 100' comprises the first light absorption layer 112, the second light absorption layer 113 adjacent to a side of the first light absorption layer 112, and the carrier-traveling or collector layer 114 adjacent to a side of the second light absorption layer 113 opposite to a side of the second light absorption layer 113 that is adjacent to the first light absorption layer 112. The SC-EEDH photodiode 100' further comprises the carrier block layer 116 adjacent to a side of the first light absorption layer 112 opposite the side to which the second light absorption layer 113 is adjacent, and a Schottky contact 118 adjacent to and covering a portion of a surface of the collector layer 114 opposite a side of the collector layer 114 that is adjacent to the second light absorption layer 113. The SC-EEDH photodiode 100' further comprises an ohmic contact 117 connected to the carrier block layer 116. The ohmic contact 117 is essentially similar to the ohmic contact 117a of the photodiode 100 and functions as an anode contact for the SC-EEDH photodiode 100' according to the present invention. In some embodiments, the SC-EEDH photodiode 100' may be mounted or formed on a supporting surface of a semi-insulating substrate 119.

The Schottky contact 118 is a metal contact material on a surface of and in intimate contact with the collector layer 114. The metal contact material in intimate contact with the collector layer 114 forms a Schottky barrier at an interface or boundary between the metal material of the contact 118 and the lattice of the semiconductor of the adjacent layer (e.g., the collector layer 114 in some embodiments). As such, the metal contact material forms the Schottky contact 118. The metal material of the Schottky contact 118 may be any metal used in semiconductor manufacture for producing a metal contact including, but not limited to, aluminum (Al), silver (Ag), gold (Au), or copper (Cu). One skilled in the art is familiar with Schottky contacts, the manufacture of and metal materials used therefor, all of which are within the scope of the present invention.

Operation of the SC-EEDH photodiode 100' is essentially equivalent to that of the EEDH photodiode 100 described hereinabove except that the contact layer 115 and ohmic contact 117b are replaced by the Schottky contact 118. In particular, for the SC-EEDH photodiode 100', photo-generated electrons exiting the collector layer 114 are absorbed directly by the Schottky contact 118 acting as a cathode contact instead of passing through the contact layer 115 and into the cathode ohmic contact 117b as was the case for the EEDH photodiode 100. Moreover, the SC-EEDH photodiode 100' eliminates the contact layer 115 and its associated bulk and contact series resistances resulting in a relatively simpler overall structure with lower series resistance for the SC-EEDH photodiode 100'. The band diagram in FIG. 3B further illustrates a relatively simpler transition from the collector 114 and the Schottky contact 118 for the SC-EEDH photodiode 100'.

Figure 4A:
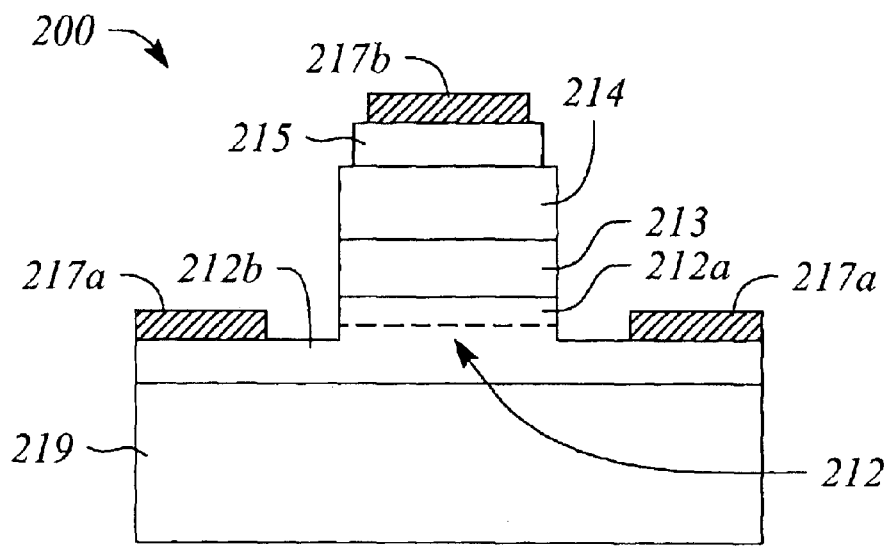
FIG. 4A illustrates a cross sectional view of the vertically illuminated enhanced extended drift heterostructure photodiode according to another embodiment of the present invention.
Figure 4B:
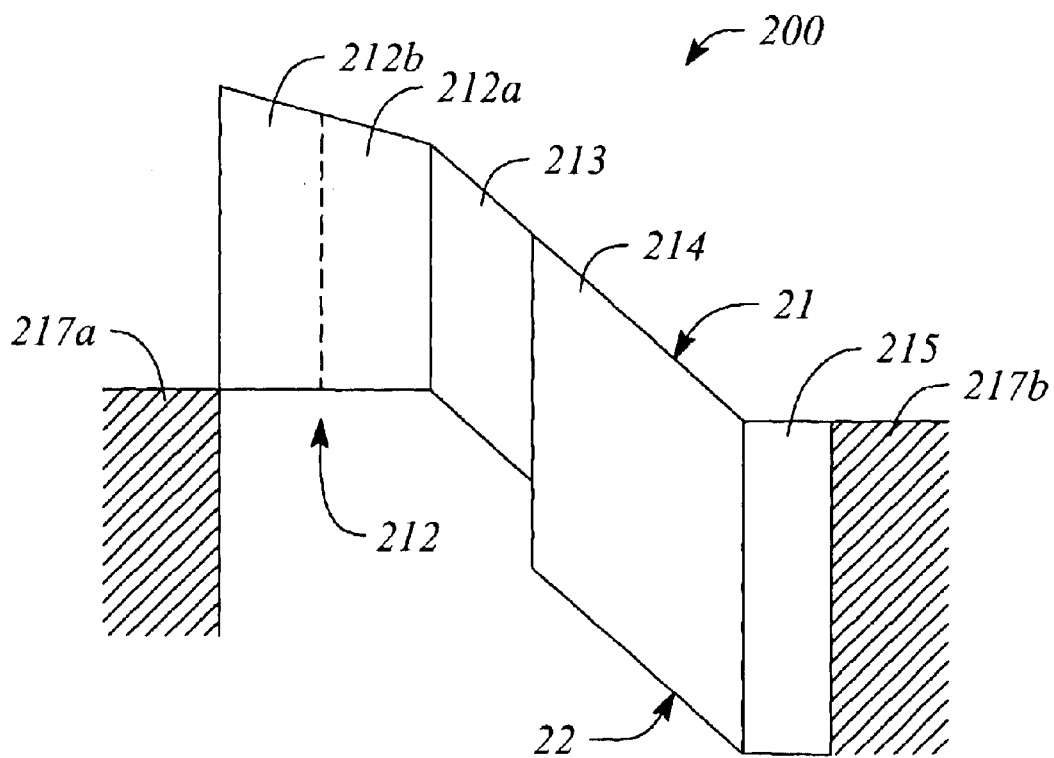
FIG. 4B illustrates a band diagram for the enhanced extended drift heterostructure photodiode embodiment illustrated in FIG. 4A.

FIG. 4A illustrates a cross sectional view of a vertically illuminated EEDH photodiode 200 according to another embodiment of the present invention. In particular, the embodiment illustrated in FIG. 4A is an EEDH photodiode 200 comprising a first light absorbing layer that has or produces a quasi-field within the layer. As used herein, a 'quasi-field' is an electric field created primarily through a controlled use of various materials within the layer wherein the created field essentially and preferentially acts only on minority carriers (e.g., electrons) within a neutrally charged layer (e.g., a first light absorption layer 212) of a semiconductor. FIG. 4B illustrates a band diagram for the EEDH photodiode 200 embodiment illustrated in FIG. 4A.

Although illustrated and described as a vertically illuminated photodiode for the purposes of discussion hereinbelow, vertical illumination is not intended to limit the scope of the present invention in any way. For example, one skilled in the art may readily produce the EEDH photodiode 200 that employs a quasi-field in the form of a horizontally illuminated or waveguide photodiode without undue experimentation according to the present invention.

The EEDH photodiode 200 comprises a 'graded band gap' light absorbing layer 212, a depleted light absorption layer 213 adjacent to a side of the graded band gap layer 212, and a carrier-traveling or collector layer 214 adjacent to a side of the depleted light absorption layer 213 that is opposite a side of the layer 213 adjacent to the graded band gap layer 212. The EEDH photodiode 200 further comprises a contact layer 215 adjacent to and covering a portion of a surface of the collector layer 214 opposite a side of the collector layer 214 that is adjacent to the depleted light absorption layer 213. The EEDH photodiode 200 further comprises a first ohmic contact 217a connected to the graded band gap layer 212 and a second ohmic contact 217b connected to the contact layer 215. The first ohmic contact 217a functions as an anode contact for the EEDH photodiode 200 while the second ohmic contact 217b serves as a cathode contact according to the present invention. In some embodiments, the EEDH photodiode 200 may be mounted or formed on a supporting surface of a semi-insulating substrate 219.

The depleted light absorption layer 213 is essentially similar to the second light absorption layer 113 described hereinabove with respect to the EEDH photodiode 100. In particular, the depleted light absorption layer 213 comprises a semiconductor that is lightly doped or undoped relative to a doping concentration of the graded band gap layer 212. As a result of the doping levels of the depleted light absorption layer 213, the layer 213 generally operates within the photodiode 200 as being substantially depleted. Moreover, the depleted light absorption layer 213 semiconductor has a band gap that facilitates light absorption and photo-generation of free carriers within the semiconductor lattice in response to incident light.

The collector layer 214 is essentially similar to the collector layer 114 described hereinabove with respect to the EEDH photodiode 100. In particular, the collector layer 214 comprises a semiconductor that is lightly doped or undoped relative to a doping level of the graded band gap layer 212. Moreover, the collector layer 214 preferably has a band gap that inhibits absorption of light and the generation of free carriers as described hereinabove with respect to the collector layer 114.

The contact layer 215 is essentially similar to the contact layer 115 described hereinabove with respect to the EEDH photodiode 100. Likewise, the anode ohmic contact 217a, cathode contact 217b and semi-insulating substrate 219 are essentially similar to the anode ohmic contact 117a, the cathode contact 117b, and semi-insulating substrate 119, respectively, described hereinabove for the previous disclosed photodiode 100.

The EEDH photodiode 200 of the present embodiment differs from the EEDH photodiode 100 embodiment in that the graded band gap layer 212 replaces the first light absorption layer 112 and the carrier block layer 116. In particular, the graded band gap layer 212, or a portion thereof, absorbs incident light and converts photons therein into free carriers. Furthermore, the graded band gap layer 212 provides a quasi-field that directs a movement of minority carriers (e.g., electrons) toward the depleted light absorption layer 213 and away from the anode ohmic contact 217a. Advantageously as a result of the existence and action of the quasi-field, the carrier block layer 116 of the previously disclosed EEDH photodiode 100 embodiment may be omitted in the EEDH photodiode 200 of the present embodiment.

The graded band gap light absorption layer 212 comprises semiconductor material having a graded band gap energy. Moreover, the grading is 'toward' a side of the layer 212 connected or adjacent to the depleted light absorption layer 213. In other words, the band gap energy of the graded band gap layer 212 semiconductor material generally increases as a function of distance from the side of the layer 212 that is connected to the depleted light absorption layer 213. As such, the band gap is generally smaller at the side of the graded band gap layer 212 connected to the depleted light absorption layer 213 than at an opposite side. The graded band gap is depicted graphically as a gradual increase in an energy level difference between the conduction band level 21 and valence band level 22 within the graded band gap layer 212 in the band diagram illustrated in FIG. 4B. As with the first light absorption layer 112 of the photodiode 100, the graded band gap layer 212 has a doping concentration (e.g., p-type doping) that exceeds a predetermined level such that at least a portion of the graded band gap layer 212 is not depleted when the photodiode 200 is reversed biased.

The band gap grading may be created in practice by forming a III–V compound semiconductor layer in which a composition of the compound semiconductor is adjusted appropriately throughout a thickness of the graded band gap layer 212. For example, if a III–V compound semiconductor of GaInAsP is employed to construct the graded band gap layer 212, ratios of the component elements, gallium, indium, arsenic, and phosphorous may be controlled and changed as a function of distance to effect a desired grading of the band gap while maintaining a desired lattice constant. Thus for example, a 100 meV or greater difference in band gap from one side of the graded band gap layer 212 to the other or opposite side may be produced by gradually varying the Ga/In/As/P component ratio within the layer 212. One skilled in the art is familiar with forming semiconductor layers having graded band gaps.

A result of grading the band gap to decrease in a direction toward the depleted light absorption layer 213 and collector layer 214 is that the quasi-field is created. In particular, minority carriers (e.g., electrons) preferentially move toward the depleted light absorption layer 213 and the collector layer 214 under the influence of the quasi-field. For example, a 100 meV difference in band gap across the graded band gap layer 212 produces a suitably strong quasi-field for directing the electron movement. Among other things, the quasi-field may reduce a response time of the photodiode 200 by preferentially accelerating the free electrons created by light absorption within the graded band gap layer 212 in a direction of the depleted light absorption layer 213 and the collector layer 214.

In principle, the graded band gap layer 212 of the EEDH photodiode 200 embodiment illustrated in FIGS. 4A and 4B may be divided into a first region or portion 212a and a second region or portion 212b. The first portion 212a is adjacent to the depleted light absorption layer 213. The first portion 212a is a portion of the graded band gap layer 212 wherein the band gap is less than or equal to an approximate energy hv of an incident photon. The second portion 212b is adjacent to the semi-insulating substrate 219 when present. The band gap of the second portion 212b is generally greater than the energy of an incident photon within the second portion 212b. As a result, the first portion 212a essentially preferentially provides absorption of incident light with a concomitant generation of free carriers, while the second portion 212b contributes relatively fewer free carriers through light absorption.

Thus, the first portion 212a may be considered to be a light absorption portion 212a functionally equivalent to the first light absorption layer 112 of the EEDH photodiode 100. The second portion 212b having a band gap that is generally higher than the band gap of the first portion 212a may be thought of as being functionally equivalent to the carrier block layer 116 of the EEDH photodiode 100. Of course, the entire graded band gap layer 212 as a whole actually acts to direct the electrons to move toward the collector layer 214 due to the presence of the quasi-field. Thus, with respect to the EEDH photodiode 200 embodiment, the entire graded band gap layer 212 advantageously replaces the carrier block layer, 116 of the photodiode 100.

Figure 5A:
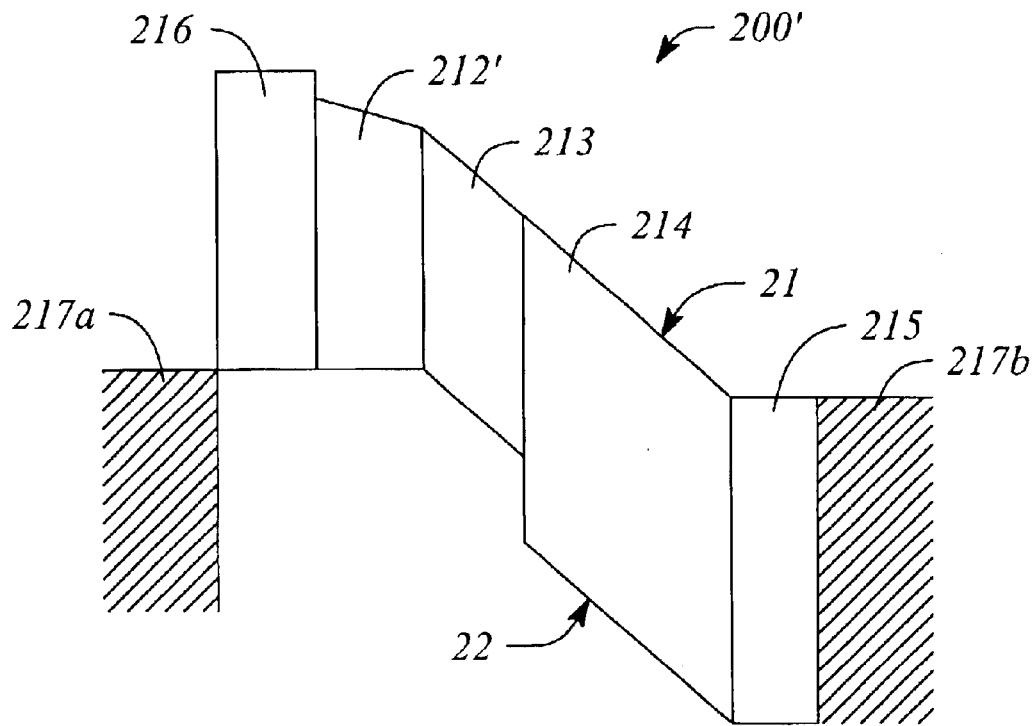
FIG. 5A illustrates a band diagram of an enhanced extended drift heterostructure photodiode having both a graded band gap layer and a carrier block layer according to an embodiment of the present invention.

In other embodiments, a carrier block layer 216 may be used in addition to the graded band gap layer 212'. A band diagram of an EEDH photodiode 200' having a graded band gap layer 212' and further comprising a carrier block layer 216 is illustrated in FIG. 5A. In such embodiments, the carrier block layer 216 preferably has a band gap that is greater than that of a highest band gap in the graded band gap layer 212'. More preferably, the highest band gap of the graded band gap layer 212' is less than or equal to the energy of an incident photon, while the band gap of the carrier block layer 216 is greater than the energy of the incident photon.

Figure 5B:
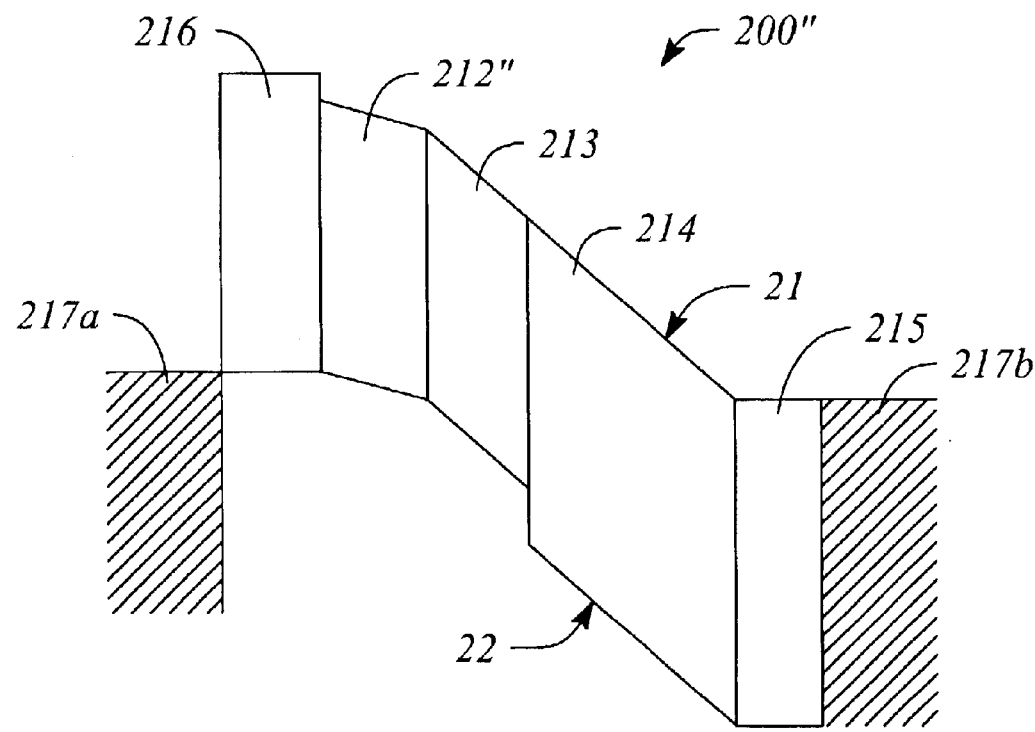
FIG. 5B illustrates a band diagram of another embodiment of an enhanced extended drift heterostructure photodiode having a graded doping concentration layer according to the present invention.

In yet other embodiments, an EEDH photodiode 200" may be realized wherein the graded band gap layer 212, 212' is replaced with a layer 212" having a graded doping concentration (e.g., p-type). FIG. 5B illustrates a band diagram of the EEDH photodiode 200" that employs a graded doping concentration layer 212". The graded doping concentration layer 212" has a doping concentration that is graded towards the depleted light absorption layer 213 in much the same way as the band gap of the graded band gap layer 212, 212' is graded toward the depleted light absorption layer 213. Moreover, the graded doping concentration creates an electric field in which both electrons and holes move. The graded doping concentration layer 212" acts to direct the electrons to move toward the depleted light absorption layer 213 due to the presence of the electric field. Also, the graded doping concentration layer 212" acts to direct the holes to move toward the carrier block layer 216 due to the presence of the electric field. As with the band gap grading embodiments of the EEDH photodiode 200 described hereinabove, the EEDH photodiode 200" employing the graded doping concentration layer 212" may be realized with or without (not illustrated) a carrier block layer 216 and still be within the scope of the present invention.

Also, it is within the scope of the present invention for the EEDH photodiode 200, 200', 200" to be realized as a Schottky contact EEDH photodiode (not illustrated) in a manner similar to that described with respect to the SC-EEDH photodiode 100'. In particular, the contact layer 215 and cathode contact 217b of the EEDH photodiode 200, 200', 200" may be replaced with a Schottky contact as described hereinabove with respect to SC-EEDH photodiode 100'.

Figure 6A:
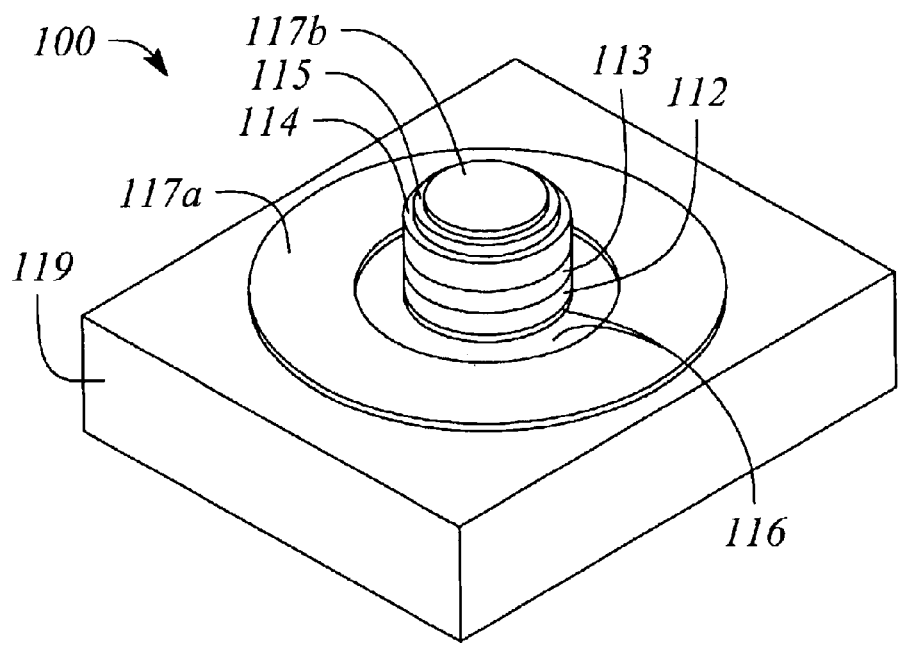
FIG. 6A illustrates a perspective view of an embodiment of the enhanced extended drift heterostructure photodiode according to the present invention.

FIG. 6A illustrates a perspective view of an embodiment of the EEDH photodiode 100 according to the present invention. In particular, FIG. 6A illustrates an exemplary 'pillbox' or concentric-contact style embodiment of the EEDH photodiode 100 according to the present invention. For the purposes of discussion only, the term 'top', as used herein, means a side of the photodiode 100 comprising the cathode contact 117b. The orientation of the EEDH photodiode 100 illustrated in FIG. 6A is a top orientation. Further, reference to the term 'bottom', as used herein, means a side of the EEDH photodiode 100 opposite to the top.

As illustrated in FIG. 6A, the ohmic contact 117a that serves as the anode contact, lies on top of and is connected to the carrier block layer 116. Furthermore, the anode ohmic contact 117a is annularly disposed around a central stack portion of the photodiode 100. The central stack portion comprises a portion of the carrier block layer 116, the first light absorption layer 112 on top of the carrier block layer 116, the second light absorption layer 113 on top of the first light absorption layer 112, the collector layer 114 on top of the second light absorption layer 113, the contact layer 115 on top of the collector layer 114 and the cathode contact 117b at the top of the stack. FIG. 6A illustrates the EEDH photodiode 100 embodiment supported by the semi-insulating substrate 119. Incident light preferably enters the exemplary EEDH photodiode 100 from below or the bottom, passing through the semi-insulating substrate 119, before entering the EEDH photodiode 100. Similar configurations to that illustrated in FIG. 6A generally may be used to construct the other embodiments 100', 200, 200', 200" of the EEDH photodiode of the present invention described hereinabove as long as the above-described differences in each of the other embodiments are taken into consideration.

Advantageously, in the vertically illuminated EEDH photodiode 100, 100', 200, 200', 200" embodiments, such as the EEDH photodiode 100 embodiment of FIG. 6A, light passes through the carrier block layer 116, 216 with little absorption. A fraction of the light is absorbed as it passes through the light absorption layers 112, 113, 212, 213. The light then passes through the collector layer 114, 214 essentially without absorption and is then reflected by the metal contact 117b, 118, 217b. The reflected light again passes through the photodiode layers but in a reverse direction. Upon passing through the light absorption layers 112, 113, 212, 213 a second time, more of the light is absorbed. As a result of the light reflecting from the metal contact 117b, 118, 217b, more photocurrent is produced and the photodiode has higher efficiency than if there was no reflection.

Figure 6B:
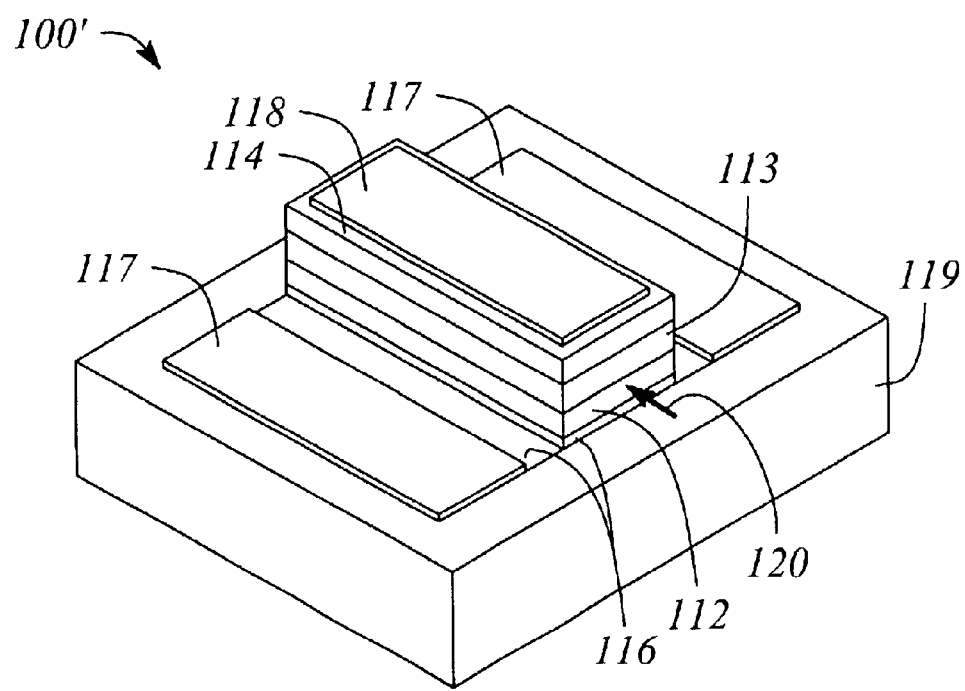
FIG. 6B illustrates a perspective view of a horizontally illuminated embodiment of the enhanced extended drift heterostructure photodiode having a Schottky contact according to the present invention.

FIG. 6B illustrates a perspective view of a horizontally illuminated exemplary embodiment of the SC-EEDH photodiode 100' according to the present invention. The exemplary embodiment illustrated in FIG. 6B is well suited for realizing a horizontally illuminated or waveguide photodiode as opposed to the primarily vertically illuminated application of the EEDH photodiode 100 embodiment illustrated in FIG. 6A. Incident light enters the exemplary embodiment of the SC-EEDH photodiode 100' from below when vertically illuminated. However, when employed as a horizontally illuminated or waveguide photodiode, incident light preferably enters the light absorption layers 112, 113 from a side. More preferably, incident light enters from a side that is perpendicular to a length dimension of the SC-EEDH photodiode 100'. An arrow 120 in FIG. 6B illustrates a path taken by incident light in an embodiment of the horizontally illuminated or waveguide SC-EEDH photodiode 100'. A similar configuration to that illustrated in FIG. 6B may be employed to construct the other EEDH photodiode embodiments 100 and 200, 200', 200", with or without the Schottky cathode 118, 218, as described hereinabove according to the present invention.

As already described, the EEDH photodiode 100 according to the present invention may be operated in a reverse biased condition or state. Under such reverse bias conditions, such as when majority carriers are present in a part of the first light absorption layer 112 and when an average current density $J_0$ is given, then a relationship may be specified between a thickness W of the layer 112 and a conductivity $\sigma$ of the layer 112. Specifically, if the conductivity $\sigma$ is constant, preferably the layer conductivity a and the layer thickness W satisfy a relationship given in equation (1)

$$\frac{J_0 \times W}{2\sigma} \le \frac{\Delta E_{\Gamma-L}}{q} \quad (1)$$

where $\Delta E_{\Gamma-L}$ is Γ-valley/L-valley energy separation and q is an electron charge. In situations wherein the conductivity $\sigma$ is not constant but has a distribution, the layer conductivity $\sigma$ and the layer thickness W preferably satisfy a relationship given in equation (2)

$$\int_0^W \frac{J_0(W-x)}{W\sigma(x)} dx \le \frac{\Delta E_{\Gamma-L}}{q} \quad (2)$$

where $\Delta E_{\Gamma-L}$ is Γ-valley/L-valley energy separation, q is an electron charge, and x is a position in the first light absorption layer 112. A rationale for and description of these relationships is provided by Ishibashi et al., U.S. Pat. No. 5,818,096, incorporated herein by reference. Equations (1) and/or (2) may be similarly applied to the EEDH photodiode 100', 200, 200', 200" by one skilled in the art without undue experimentation.

Figure 7A:
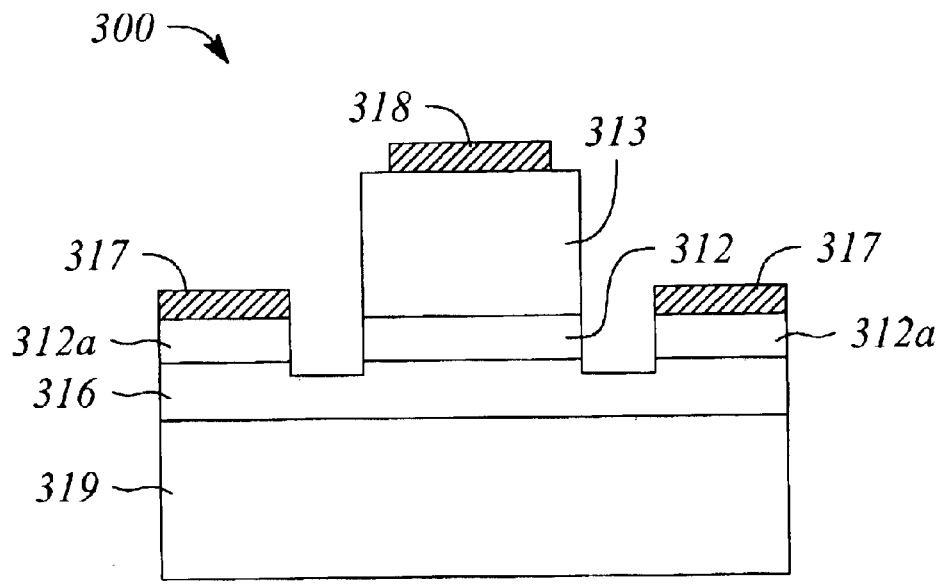
FIG. 7A illustrates a cross sectional view of a vertically illuminated embodiment of an enhanced extended drift heterostructure photodiode according to the present invention wherein a collector layer is omitted and a Schottky contact is employed.
Figure 7B:
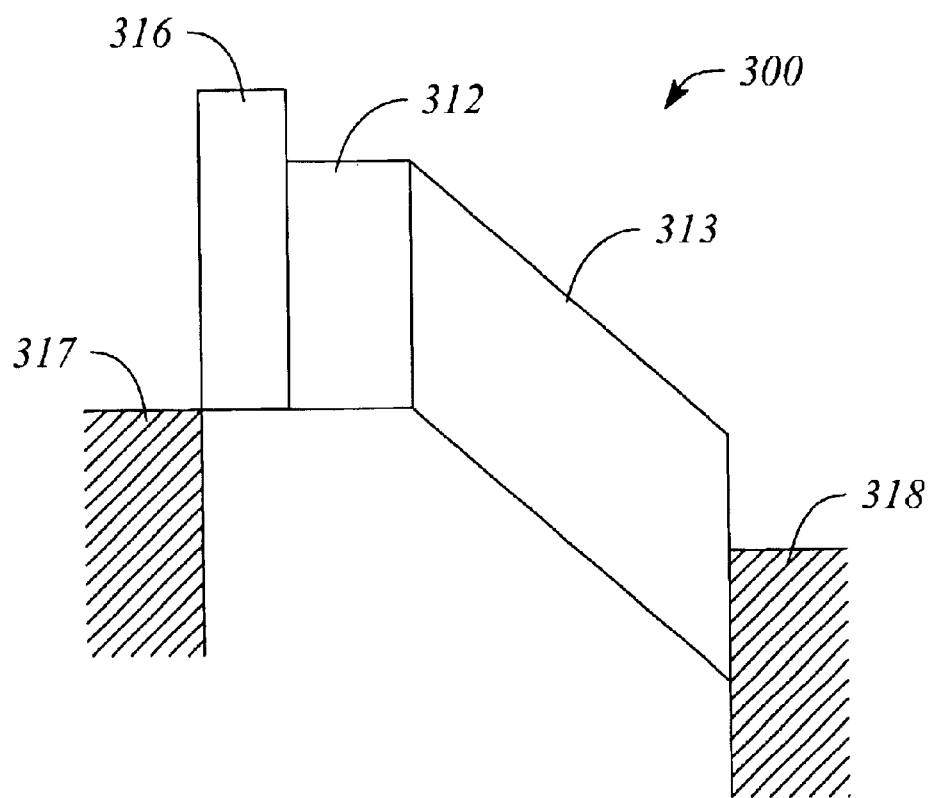
FIG. 7B illustrates a band diagram for the enhanced extended drift heterostructure photodiode embodiment illustrated in FIG. 7A.

FIG. 7A illustrates a cross sectional view of a vertically illuminated embodiment of an EEDH photodiode 300 according to the present invention wherein a collector layer is omitted and a Schottky contact (SC) is employed. In particular, the SC-EEDH photodiode 300 illustrated in FIG. 7A is similar to the SC-EEDH photodiode 100' illustrated in FIG. 3A, except that the collector layer 114 is omitted. FIG. 7B illustrates a band diagram for the SC-EEDH photodiode 300 illustrated in FIG. 7A. Omission of the collector layer as exemplified in the embodiment illustrated in FIG. 7A and FIG. 7B may advantageously eliminate a conduction band mismatch in some material combinations. Such a conduction band mismatch can interfere with the free-flow of photogenerated electrons, among other things.

The SC-EEDH photodiode 300 comprises a first light absorption layer 312 and a second light absorption layer 313 adjacent to a side of the first light absorption layer 312. The SC-EEDH photodiode 300 further comprises a carrier block layer 316 adjacent to a side of the first light absorption layer 312 opposite the side to which the second light absorption layer 313 is adjacent, and a Schottky contact 318 adjacent to and covering a portion of a surface of the second light absorption layer 313 opposite a side of the second light absorption layer 313 that is adjacent or connected to the first light absorption layer 312. The SC-EEDH photodiode 300 further comprises an ohmic contact 317 connected to the carrier block layer 316. The ohmic contact 317 is essentially similar to the ohmic contact 117 of the photodiode 100' and functions as an anode contact for the SC-EEDH photodiode 300 according to the present invention. As was described with respect to the SC-EEDH photodiode 100', the ohmic contact 317 may be directly or indirectly interfaced to the carrier block layer 316. In some embodiments, the SC-EEDH photodiode 300 may be mounted or formed on a supporting surface of a semi-insulating substrate 319.

The first light absorption layer 312 is essentially similar to the first light absorption layer 112 described hereinabove with respect to the EEDH photodiode 100, 100'. In particular, the first light absorption layer 312 is a semiconductor of a first conduction type, for example, a p-type semiconductor preferably having a band gap that facilitates light absorption/conversion in an optical wavelength range of interest. For example, the first light absorption layer 312 may be a III–V compound semiconductor such as, but not limited to, gallium-aluminum-arsenide (GaAlAs) doped with a p-type dopant. In addition, the first light absorption layer 312 semiconductor has a doping concentration sufficient to maintain charge neutrality in at least a portion of the layer 312 under a biased state or condition of the photodiode 300.

The second light absorption layer 313 is essentially similar to the second light absorption layer 113 described hereinabove with respect to the EEDH photodiode 100, 100'. In particular, the second light absorption layer 313 comprises a semiconductor that is lightly doped or undoped relative to a doping concentration of the first light absorption layer 312. As a result of the doping levels of the second light absorption layer 313, the layer 313 generally operates within the EEDH photodiode 300 as a depleted semiconductor layer. Moreover, the second light absorption layer 313 semiconductor has a band gap that facilitates light absorption and photo-generation of free carriers within the semiconductor lattice in response to incident light.

The carrier block layer 316 is essentially similar to the carrier block layer 116 described hereinabove with respect to the EEDH photodiode 100, 100'. In particular, the carrier block layer 316 is a semiconductor of the first conduction type, for example a p-type semiconductor. The semiconductor of the carrier block layer 316 has a band gap that is greater than the band gap of the light absorption layers 312, 313. The band gap of the carrier block layer 316 (being greater than that of the light absorbing layers 312, 313) at least reduces, and preferably greatly reduces or substantially prevents, a chance that free electrons created in the light absorption layers 312, 313 will move in a direction of the carrier block layer 316.

The Schottky contact 318 is essentially similar to the Schottky contact 118 described hereinabove with respect to the SC-EEDH photodiode 100'. In particular, the Schottky contact 318 is a metal contact material on a surface of and in intimate contact with its adjacent layer, which is the second light absorption layer 313 for the SC-EEDH photodiode 300. The metal contact material in intimate contact with the second light absorption layer 313 forms a Schottky barrier at an interface or boundary between the metal material of the contact 318 and the lattice of the semiconductor of the second light absorption layer 313. As such, the metal contact material forms the Schottky contact 318. The metal material of the Schottky contact 318 may be any metal used in semiconductor manufacture for producing a metal contact including, but not limited to, aluminum (Al), silver (Ag), gold (Au), or copper (Cu).

In some embodiments and as illustrated in FIG. 7A, another layer 312a may be employed between the ohmic anode contact 317 and the carrier block layer 316 to indirectly interface the contact 317 to the carrier block layer 316. For example, a portion 312a of a layer used to create the first light absorption layer 312 may be physically separated from the first light absorption layer 312 during processing to form the photodiode 300, such as the portion 112a of layer 112 described above for the EEDH photodiode 100 embodiment illustrated in FIG. 2C.

The EEDH photodiode 300 with an omitted collector layer is described with reference to an embodiment having a Schottky contact 318. However, it is within the scope of the present invention for the EEDH photodiode 300 to be realized as any of the other embodiments of the EEDH photodiode 100, 200, 200', 200" described hereinabove by omitting the respective collector layer 114, 214. In particular, an EEDH photodiode (not illustrated) having a contact layer and ohmic cathode contact similar to the contact layer 115 and ohmic cathode contact 117b may be produced by omitting the collector layer 114 from the EEDH photodiode 100 described hereinabove. Moreover, except to the extent that the collector layer is absent, the EEDH photodiode 300 operates in a similar manner to the SC-EEDH photodiode 100' described hereinabove. Similarly, EEDH photodiodes (not illustrated) without the collector layer 214 may be produced from the EEDH photodiodes 200, 200', 200" described hereinabove by omitting the collector layer 214. One skilled in the art may readily extend the discussion hereinabove to such photodiodes with omitted collector layers without undue experimentation.

Figure 8:
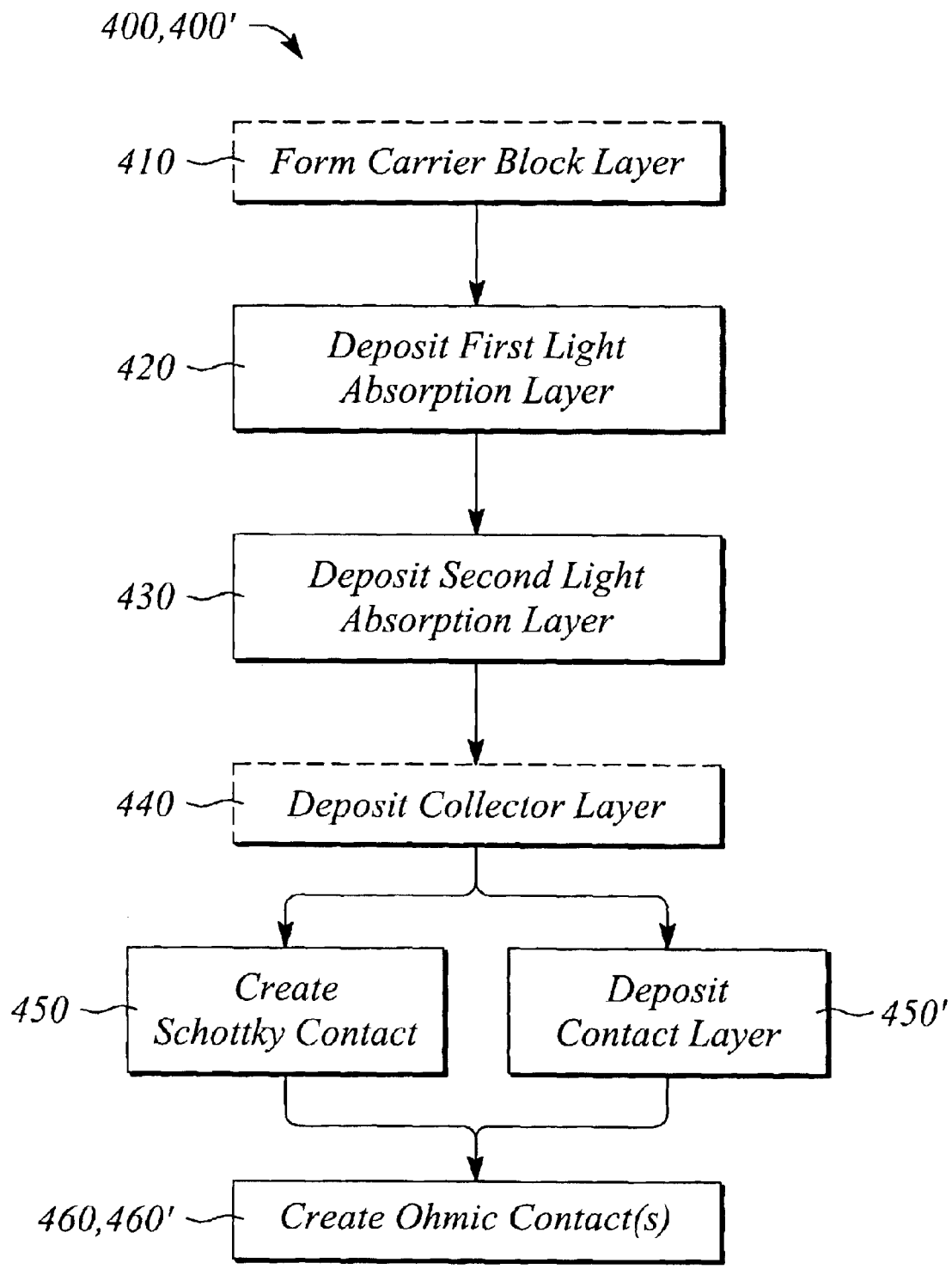
FIG. 8 illustrates a flow chart of a method of constructing an enhanced extended drift heterostructure photodiode according to an embodiment of the present invention.

FIG. 8 illustrates a flow chart of a method 400, 400' of constructing an EEDH photodiode according to the present invention. The method 400 constructs the EEDH photodiode with a Schottky cathode contact. The method 400' constructs the EEDH photodiode with dual ohmic anode contacts. The method 400, 400' comprises forming 410 a carrier block layer on or in a top surface of a semi-insulating substrate. The carrier block layer may be formed 410 using an epitaxial deposition of a semiconductor layer on the top surface of the semi-insulating substrate. Any and all methods of epitaxial deposition suitable for semiconductor layer deposition may be employed to form 410 the carrier block layer. For example, a p-type III–V compound semiconductor may be formed 410 using molecular-beam epitaxy (MBE) or metal-organic chemical vapor deposition (MOCVD) for epitaxial deposition. Alternatively, the carrier block layer may be formed 410 within the top surface of the semi-insulating substrate by selective doping of the substrate such as by dopant diffusion or ion implantation. Selective doping forms 410 the carrier block layer as a 'well' within the lattice of the semi-insulating substrate. Preferably, the formed 410 carrier block layer has the characteristics of the carrier block layer 116, 216, 316 described hereinabove with respect to the EEDH photodiode 100, 200', 200", 300 embodiments. In some embodiments of the EEDH photodiode of the present invention, such as EEDH photodiode 200, the carrier block layer is omitted and/or optional. Therefore in the method of constructing 400, 400', forming 410 a carrier block layer is optional. The box outlining 'forming carrier block layer' 410 in FIG. 8 is shown with a dashed-line to illustrate that such forming 410 is optional.

The method 400, 400' further comprises depositing 420 a first light absorption layer on top of either the formed 410 carrier block layer or on or in the top surface of the semi-insulating substrate. The deposition 420 may be by way of epitaxial deposition or any other deposition methodology known in the art and suitable for semiconductor manufacturing. For example, a p-type III–V compound semiconductor may be deposited 420 using MBE or MOCVD. Preferably, the deposited 420 first light absorption layer is similar to and has characteristics of the first light absorption layer 112, 112a, 212, 312 described hereinabove with respect to the EEDH photodiode 100, 200, 300 the graded band gap light absorption layer 212' of the EEDH photodiode 200', or the graded doping light absorption layer 212" of the EEDH photodiode 200", depending on the embodiment being constructed.

The method 400, 400' further comprises depositing 430 a second light absorption layer on top of the deposited 420 first light absorption layer. The deposition 430 may be by way of epitaxial deposition or any other deposition methodology known in the art and suitable for semiconductor manufacturing. For example, a III–V compound semiconductor may be deposited 430 on top of the first light absorption layer using MBE or MOCVD. Preferably, the deposited 430 second light absorption layer is similar to and has characteristics of the second light absorption layer 113, 313 or the depleted light absorption layer 213, described hereinabove with respect to the EEDH photodiode 100, 100', 200, 200', 200", 300 depending on the embodiment.

In some embodiments, the method 400, 400' optionally further comprises depositing 440 a collector layer on top of the second light absorption layer. As illustrated in FIG. 8, a 'dashed' line indicates that depositing 440 the collector layer is optional in some embodiments. The deposition 440 may be by way of epitaxial deposition or any other deposition methodology suitable for manufacturing semiconductors. For example, an n-type or undoped III–V compound semiconductor may be deposited 440 on top of the second light absorption layer using MBE or MOCVD. Preferably, the deposited 440 collector layer is similar to and has characteristics of the collector layer 114, 214 described hereinabove with respect to the EEDH photodiode 100, 200, 200', 200".

In some embodiments, the method 400 further comprises creating 450 a Schottky contact on a top surface of the photodiode, such as on the collector layer in some embodiments or the second light absorption layer in other embodiments. The Schottky contact may be created 450 on the top surface by any methodology suitable for creating a Schottky contact. In particular, a metal may be evaporated or sputter deposited onto the top surface after any oxide layer that may have formed thereon is removed. Preferably, the created 450 Schottky contact has characteristics of the Schottky contact 118, 318 described hereinabove with respect to the EEDH photodiode 100', 200, 200', 200", 300. In particular, the created 450 Schottky contact is a cathode contact for the EEDH photodiode.

In other embodiments, the method 400' further comprises depositing 450' a contact layer on a top surface of the photodiode, such as on the collector layer in some embodiments or the second light absorption layer in other embodiments. The deposition 450' may be by way of epitaxial deposition or any other deposition methodology suitable for manufacturing semiconductors. For example, a heavily doped n-type III–V compound semiconductor may be deposited 450' on the top surface using MBE or MOCVD. Preferably, the deposited 450' contact layer is similar to and has characteristics of the contact layer 115, 215 described hereinabove with respect to the EEDH photodiode 100, 200, 200', 200", 300.

The method 400, 400' further comprises creating 460 ohmic contact(s). For embodiments of the method 400 having created 450 the Schottky contact, an ohmic contact is created 460 on a top surface of either the carrier block layer or a portion of the first light absorption layer as the anode contact. For embodiments of the method 400' having created 450' a contact layer, an ohmic contact is created 460' on a top surface of the contact layer as a cathode contact in addition to the top surface of either the carrier block layer or a portion of the first light absorption layer as the anode contact. The anode ohmic contact may be created 460, 460' on a top surface in the carrier block layer or the first light absorption layer, such as a separated portion of the first light absorption layer, or on a top surface of another layer overlying either the carrier block layer or the first absorption layer. Similarly, the cathode contact may be created 460' on the contact layer or another layer may be applied to a surface of the contact layer before the ohmic contact is created 460' on the contact layer.

The ohmic contact may be created 460, 460' by any methodology suitable for creating an ohmic contact. In particular, a metal may be evaporated or sputter deposited onto a top surface of the respective layer. Preferably, the metal is deposited after any oxide layer that may have formed on the surface is removed. The created 460, 460' ohmic contact preferably has characteristics of one or both of the ohmic contacts 117, 117a, 117b, 217a, 217b described hereinabove with respect to the EEDH photodiode 100, 100', 200, 200', 200", 300.

In some embodiments of the method 400, the ohmic contact that forms the anode is created 460 and connected to the carrier block layer or the light absorption layer simultaneously with creating 450 the Schottky contact. Alternatively, the ohmic contact may be created 460, 460' at another time during the method 400, 400' of constructing. Similarly, etching or another form of mechanical shaping of one or more of the layers of the photodiode may be performed at various times during the method 400, 400' of constructing and still be within the scope of the present invention.

As used herein, the term 'semiconductor' means any inorganic or organic compound that possesses the properties and characteristics that normally define semiconductors to one skilled in the art. Such properties include, but are not limited to, a conductivity that is intermediate between a conductivity of a conductor and a conductivity of an insulator. Semiconductor characteristics derive from an electronic band structure having a conduction band in which electrons are mobile charge carriers and a valence band in which holes are mobile charge carriers, between which is a so-called 'forbidden' energy band gap. Within the band gap, charges are essentially not mobile. In an intrinsic or undoped semiconductor, a Fermi level or average electron energy is within the forbidden energy band gap. Thus, only a small number of electrons in the conduction band and holes in the valence band of an intrinsic semiconductor are mobile and able to conduct current resulting in the 'semiconductivity' of semiconductors. Semiconductors can be doped with elements or compounds that act as 'donors' or 'acceptors' to change the Fermi level and alter the material conductivity and conductivity type.

While certain examples are cited hereinabove, all semiconductor layers of the EEDH photodiode 100, 100', 200, 200', 200", 300 may be constructed from virtually any semiconductor within the constraints that layer lattices are compatible and that a lattice constant is maintained to avoid detrimental strain. In other words, deviations from the lattice constant that result in lattice defects are undesirable as is well known to one skilled in the art.

As mentioned hereinabove, zinc-blende III–V compounds may be employed as semiconductor layers described hereinabove. Specifically, band gap energies of zinc-blende III–V compound semiconductors are plotted vs. lattice constant by I. Vurgaftman, J. R. Meyer, and L. R. Ram-Mohan "Band parameters for III–V compound semiconductors and their alloys," *J. Appl. Phys.*, v. 89, n. 11, Jun. 1, 2001, pp. 5815–5875, incorporated herein by reference. Lattice-matched semiconductors may be selected from any combination of materials, including tri-nary and quaternary materials, represented along any approximately vertical line drawn in the plot of Vurgaftman et al. Thus, the EEDH photodiode 100 may be fabricated from materials represented by a line between GaAs and AlAs, representing alloys of AlGaAs, for example. Thus in this example, the light absorbing layers 112, 113 might be composed of GaAs and the carrier block layer 116 and collector layer 114 might be $Al_{0.5}Ga_{0.5}As$. The GaAs-AlAs group is often a preferred group since it represents a simpler system. Specifically, the lattice constant of GaAs is nearly the same as the lattice constant of AlAs enabling a good lattice match between various layers.

A similar situation facilitating a reasonable opportunity for engineering of layer band gaps through the use of ternary and quaternary compounds while providing a good lattice match between layers exists for other Ga- and Al-compounds, such as GaP and AlP, and GaSb and AlSb. Other material systems, such as those based on InP, which is popular for fiber optic communications optoelectronics, do not have this simplicity and require the use of quaternary compounds or discrete ternaries to engineer the band gaps while maintaining lattice match. For example, an EEDH photodiode 100 might employ InGaAs in the light absorption layers 112, 113 and InGaAsP in the carrier block layer 116 and the collector layer 114.

Two additional important classes of semiconductors that also may be used in the construction of the EEDH photodiode 100, 100', 200, 200', 200", 300 are based on silicon (Si) and germanium (Ge). Also considered viable candidates for use in constructing the EEDH photodiode according to the present invention are compound semiconductors composed of materials chosen from column II and column VI elements of the periodic chart. Specifically, so-called 'II–VI' compound semiconductors may also be used in the construction of the EEDH photodiode 100, 100', 200, 200', 200", 300. Moreover, an emerging class of compounds from which the EEDH photodiode 100, 100', 200, 200', 200", 300 may be constructed is the class of organic semiconductors.

Also as used herein, a metal is any inorganic or organic compound that possesses properties that normally define metals, such as high conductivity. Metals have an electronic band structure in which the Fermi level is within a conduction band. As a result, there are many mobile electrons available to carry current in a metal. The presence of many mobile electrons produces the high conductivity of metals.

As has been described hereinabove, metals are used in the formation of ohmic contacts 117, 117a, 117b, 217a, 217b, 317 and Schottky contacts 118, 318 in the EEDH photodiodes 100, 100', 200, 200', 200", 300. Many metals are commonly used in the formation of such contacts in semiconductor devices. Quite often, more than one metal is used in layers or alloys to achieve certain desired results. As one skilled in the art can readily attest, a choice of specific metals is governed by factors such as the metal work function, deposition methods, chemical properties for etching or other processing techniques, chemical interactions with the other materials, such as formation of compounds or oxides, and diffusion coefficients among the various constituents. Metals often employed in conjunction with semiconductor fabrication include, but are not limited to, magnesium (Mg), aluminum (Al), titanium (Ti), vanadium (V), chromium (Cr), manganese (Mn), cobalt (Co), nickel (Ni), copper (Cu), zinc (Zn), molybdenum (Mo), palladium (Pd), silver (Ag), cadmium (Cd), indium (In), tin (Sn), tungsten (W), iridium (Ir), lead (Pt), and gold (Au). The use of all such metals and alloys, and layered combinations thereof, in the formation/fabrication of the ohmic contacts 117, 117a, 117b, 217a, 217b, 317 and/or the Schottky contacts 118, 318 are within the scope of the present invention.

Thus, there have been described several embodiments of an enhanced extended drift heterostructure (EEDH) photodiode and several embodiments of a method of constructing an EEDH photodiode. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. An enhanced extended drift heterostructure (EEDH) photodiode comprising:
    a first semiconductor layer having a first doping concentration that maintains a charge neutrality condition in at least a portion of the first semiconductor layer;
    a second semiconductor layer adjacent and interfaced to the first semiconductor layer, the second semiconductor layer having a second doping concentration that is lower than the first doping concentration, such that the second semiconductor layer is depleted, wherein the first and second semiconductor layers comprise respective first and second band gap energies that facilitate light absorption by the first and second semiconductor layers;
    an ohmic anode contact interfaced to the first semiconductor layer; and
    a cathode contact interfaced to the second semiconductor layer,
    wherein a characteristic of one or more of the semiconductor layers in addition to the second semiconductor layer directs a movement of photo-generated electrons away from the ohmic anode contact.

2. The EEDH photodiode of claim 1, further comprising a carrier block semiconductor layer adjacent and interfaced to the first semiconductor layer on a side opposite to the second semiconductor layer, the carrier block semiconductor layer having the characteristic and having a block band gap energy that is greater than the first and second band gap energies, such that a block energy barrier is created between the first semiconductor layer and the carrier block semiconductor layer to so direct the electron movement, the carrier block semiconductor layer being nonconducive to light absorption relative to the first and second semiconductor layers.

3. The EEDH photodiode of claim 2, wherein the first semiconductor layer further has the characteristic in that one or both of the first band gap energy and the first doping concentration is graded to produce a quasi-field, the quasi-field preferentially moving the photo-generated electrons toward the second semiconductor layer, wherein the graded first band gap energy decreases from a large band gap energy at the opposite side of the first semiconductor layer to a relatively smaller band gap energy at the first side of the first semiconductor layer adjacent to the second semiconductor layer, and wherein the graded doping concentration increases as a function of distance from the first side of the first semiconductor layer that is adjacent to the second semiconductor layer.

4. The EEDH photodiode of claim 1, wherein the first semiconductor layer has the characteristic in that one or both of the first band gap energy and the first doping concentration of the first semiconductor layer is graded to produce a quasi-field, the quasi-field preferentially moving the photo-generated electrons toward the second semiconductor layer, wherein the graded first band gap energy decreases from a large band gap energy at the opposite side of the first semiconductor layer to a relatively smaller band gap energy at tile first side of the first semiconductor layer adjacent to the second semiconductor layer, and wherein the graded doping concentration increases as a function of distance from the first side of the first semiconductor layer that is adjacent to the second semiconductor layer.

5. The EEDH photodiode of claim 1, further comprising:
    a collector semiconductor layer adjacent and interfaced to the second semiconductor layer on a side opposite to the first semiconductor layer, the collector semiconductor layer having a collector band gap energy that is greater than the first and second band gap energies, the collector semiconductor layer further having a collector doping concentration that is lower than the first doping concentration, the collector semiconductor layer being nonconducive to light absorption relative to the first semiconductor layer and the second semiconductor layer.

6. The EEDH photodiode of claim 1, wherein the cathode contact comprises a Schottky cathode contact interfaced to the second semiconductor layer.

7. The EEDH photodiode of claim 1, wherein the cathode contact comprises:
    an ohmic cathode contact interfaced to the second semiconductor layer; and
    a contact semiconductor layer between and the ohmic cathode contact and the second semiconductor layer, the contact semiconductor layer being interfaced to the ohmic cathode contact, wherein the first semiconductor layer has a first conduction type, the contact semiconductor layer having a second conduction type.

8. The EEDH photodiode of claim 2, further comprising:
a semiconductor layer between the anode contact and the carrier block semiconductor layer, the semiconductor layer indirectly interfacing the anode contact to the carrier block semiconductor layer, wherein the semiconductor layer optionally is a physically separated portion of the first semiconductor layer.

9. The EEDH photodiode of claim 1, further comprising a semi-insulating substrate that supports the layers in a stacked relationship.

10. An enhanced extended drift heterostructure (EEDH) photodiode comprising:
- a first semiconductor layer in a first conduction type having a first doping concentration;
- a second semiconductor layer adjacent and interfaced to a side of the first semiconductor layer, the second semiconductor layer having a second doping concentration lower than the first doping concentration;
- a carrier block semiconductor layer adjacent and interfaced to an opposite side of the first semiconductor layer,
- a Schottky cathode contact interfaced to a side of the second semiconductor layer opposite the first semiconductor layer; and
- an ohmic anode contact interfaced to the carrier block semiconductor layer,
- wherein the first semiconductor layer has a first band gap energy that facilitates absorption of light, the first doping concentration maintaining a charge neutrality condition in at least a portion of the first semiconductor layer, the second light, and wherein the carrier block semiconductor layer has a block band gap energy that is greater than the first and second band gap energies, such that a block energy barrier is created between the first light absorption layer and the carrier block semiconductor layer, wherein the carrier block semiconductor layer is nonconducive to tight absorption relative to the first semiconductor layer and the second semiconductor layer.

11. The EEDH photodiode of claim 10, further comprising a semi-insulating substrate that supports the layers in a stacked relationship.

12. The EEDH photodiode of claim 10, further comprising:
- a collector semiconductor layer between and interfaced to the second semiconductor layer and the Schottky cathode contact, the collector semiconductor layer having a collector band gap energy, the collector band gap energy being greater than the first and second band gap energies, the collector semiconductor layer further having a collector doping concentration that is lower than the first doping concentration, wherein the collector semiconductor layer is nonconducive to light absorption relative to the first semiconductor layer and the second semiconductor layer.

13. An enhanced extended drift heterostructure (EEDH) photodiode comprising:
- a first light absorption layer comprising a first semiconductor having a first band gap energy and a first doping concentration, one or both of the first band gap energy and the first doping concentration having a graded characteristic, such that a quasi-field is produced within the first light absorption layer, the first doping concentration maintaining a charge neutrality condition in at least a portion of the first light absorption layer; and
- a second light absorption layer adjacent and interfaced to a first side of the first light absorption layer, the second light absorption layer comprising a second semiconductor having a second band gap energy and a second doping concentration, the second doping concentration being lower than the first doping concentration, such that the second light absorption layer is depleted, the first and second hand gap energies facilitating light absorption by the first and second light absorption layers.

14. The EEDH photodiode of claim 13, further comprising:
- a Schottky contact interfaced to the second light absorption layer on a side of the second light absorption layer opposite to the first light absorption layer, the Schottky contact being a cathode contact; and
- an ohmic anode contact interfaced to the first light absorption layer.

15. The EEDH photodiode of claim 13, further comprising:
- an ohmic anode contact interfaced to the first light absorption layer;
- a contact layer interfaced to the second light absorption layer on a side opposite to the first light absorption layer, wherein the first semiconductor of the first light absorption layer has a first conduction type, the contact layer comprising a semiconductor in a second conduction type; and
- an ohmic cathode contact interfaced to the contact layer.

* * * * *